(12) United States Patent
Imai et al.

(10) Patent No.: US 10,804,432 B2
(45) Date of Patent: Oct. 13, 2020

(54) FREE-STANDING SUBSTRATE COMPRISING POLYCRYSTALLINE GROUP 13 ELEMENT NITRIDE AND LIGHT-EMITTING ELEMENT USING SAME

(71) Applicant: NGK INSULATORS, LTD., Nagoya, Aichi (JP)

(72) Inventors: Katsuhiro Imai, Nagoya (JP);
Yoshitaka Kuraoka, Okazaki (JP);
Mikiya Ichimura, Ichinomiya (JP);
Takayuki Hirao, Nisshin (JP)

(73) Assignee: NGK INSULATORS, LTD., Nagoya, Aichi (JP)

( * ) Notice: Subject to any disclaimer, the term of this patent is extended or adjusted under 35 U.S.C. 154(b) by 0 days.

(21) Appl. No.: 16/059,751

(22) Filed: Aug. 9, 2018

(65) Prior Publication Data
US 2018/0350918 A1 Dec. 6, 2018

Related U.S. Application Data

(63) Continuation of application No. PCT/JP2017/004926, filed on Feb. 10, 2017.

(30) Foreign Application Priority Data

Feb. 25, 2016 (JP) .................................. 2016-034005

(51) Int. Cl.
*H01L 33/32* (2010.01)
*H01L 31/0392* (2006.01)
(Continued)

(52) U.S. Cl.
CPC ................ *H01L 33/32* (2013.01); *C30B 9/12* (2013.01); *C30B 19/02* (2013.01); *C30B 19/12* (2013.01);
(Continued)

(58) Field of Classification Search
CPC ............. H01L 21/0242; H01L 21/0243; H01L 21/0254; H01L 21/02576; H01L 21/02579;
(Continued)

(56) References Cited

U.S. PATENT DOCUMENTS 7,507,292 B2 3/2009 Sasaki et al.
9,640,720 B2 5/2017 Watanabe et al.
(Continued)

FOREIGN PATENT DOCUMENTS

JP 4001170 B2 8/2007
JP 2010-132556 A 6/2010
(Continued)

OTHER PUBLICATIONS

International Preliminary Report on Patentability for PCT/JP2017/004926, dated Aug. 28, 2018 (1 pg.).
(Continued)

*Primary Examiner* — Seahvosh Nikmanesh
(74) *Attorney, Agent, or Firm* — Flynn Thiel, P.C.

(57) ABSTRACT

A free-standing substrate of a polycrystalline nitride of a group 13 element contains a plurality of monocrystalline particles having a particular crystal orientation in approximately a normal direction. The polycrystalline nitride of the group 13 element is composed of gallium nitride, aluminum nitride, indium nitride or a mixed crystal thereof. The free-standing substrate has a top surface and bottom surface. The free-standing substrate contains at least one of zinc and calcium. A root mean square roughness Rms at the top surface is 3.0 nm or less.

13 Claims, 6 Drawing Sheets

(51) Int. Cl.
| | |
|---|---|
| *H01L 31/16* | (2006.01) |
| *H01L 21/02* | (2006.01) |
| *C30B 19/12* | (2006.01) |
| *C30B 29/40* | (2006.01) |
| *H01L 31/0304* | (2006.01) |
| *C30B 19/02* | (2006.01) |
| *C30B 9/12* | (2006.01) |
| *C30B 25/18* | (2006.01) |
| *H01L 29/04* | (2006.01) |
| *H01L 29/165* | (2006.01) |
| *H01L 33/18* | (2010.01) |
| *H01L 33/06* | (2010.01) |
| *H01L 29/20* | (2006.01) |
| *H01L 33/16* | (2010.01) |
| *C30B 29/68* | (2006.01) |

(52) U.S. Cl.
CPC .......... *C30B 25/183* (2013.01); *C30B 29/406* (2013.01); *C30B 29/68* (2013.01); *H01L 21/0242* (2013.01); *H01L 21/0243* (2013.01); *H01L 21/0254* (2013.01); *H01L 21/02458* (2013.01); *H01L 21/02576* (2013.01); *H01L 21/02579* (2013.01); *H01L 21/02625* (2013.01); *H01L 21/02628* (2013.01); *H01L 29/04* (2013.01); *H01L 29/165* (2013.01); *H01L 31/03044* (2013.01); *H01L 31/0392* (2013.01); *H01L 33/06* (2013.01); *H01L 33/16* (2013.01); *H01L 33/18* (2013.01); *H01L 29/2003* (2013.01); *Y02E 10/50* (2013.01)

(58) Field of Classification Search
CPC ......... H01L 21/02625; H01L 21/02628; H01L 29/04; H01L 29/165; H01L 31/0392; H01L 33/06; H01L 33/16; H01L 33/18; H01L 29/2003; C30B 9/12; C30B 19/02; C30B 25/183; C30B 29/406; C30B 29/68
See application file for complete search history.

(56) References Cited

U.S. PATENT DOCUMENTS

| | | |
|---|---|---|
| 2002/0011599 A1 | 1/2002 | Motoki et al. |
| 2006/0183625 A1 | 8/2006 | Miyahara |
| 2010/0158066 A1* | 6/2010 | Morizumi ............ H01S 5/0281 372/49.01 |
| 2013/0313567 A1 | 11/2013 | Furuya et al. |
| 2015/0144956 A1* | 5/2015 | Watanabe ............... H01L 33/32 257/76 |

FOREIGN PATENT DOCUMENTS

| | | |
|---|---|---|
| JP | 2011-068548 | 4/2011 |
| JP | 5039813 B2 | 7/2012 |
| JP | 2012-184144 A | 9/2012 |
| JP | 2013-006762 | 1/2013 |
| JP | 5770905 B1 | 7/2015 |
| WO | WO 2005/003414 A1 | 1/2005 |
| WO | WO 2015/151902 A1 | 10/2015 |

OTHER PUBLICATIONS

English translation of Written Opinion of the International Searching Authority for PCT/JP2017/004926, dated Mar. 7, 2017 (4 pgs.).
International Search Report for corresponding application No. PCT/JP2017/004926 (1 pg).

* cited by examiner

FREE-STANDING SUBSTRATE COMPRISING POLYCRYSTALLINE GROUP 13 ELEMENT NITRIDE AND LIGHT-EMITTING ELEMENT USING SAME

CROSS-REFERENCE TO RELATED APPLICATIONS

This is a continuation of International Application No. PCT/JP2017/004926, filed Feb. 10, 2017, which claims the priority of Japanese Patent Application No. 2016-034005, filed Feb. 25, 2016, the entire contents of which are incorporated herein by reference.

TECHNICAL FIELD

The present invention relates to a free-standing substrate of a polycrystalline 13-group element nitride and a light emitting device using the substrate.

BACKGROUND ART

Light emitting devices such as light emitting diodes (LEDs) that use sapphire (α-alumina single crystal) as a monocrystalline substrate, with various types of gallium nitride (GaN) layers formed thereon have been known. For example, light emitting devices have been mass-produced having a structure in which an n-type GaN layer, a multiple quantum well (MQW) layer with an InGaN quantum well layer and a GaN barrier layer laminated alternately therein, and a p-type GaN layer are formed in a laminated manner in this order on a sapphire substrate. There have also been proposed multilayer substrates suitable for such an application. Patent Document 1, for example, proposes a gallium nitride crystal multilayer substrate including a sapphire base substrate and a gallium nitride crystal layer formed through crystal growth on the substrate.

It will be appreciated that when a GaN layer is formed on a sapphire substrate, dislocation is likely to occur because the GaN layer has a lattice constant and a thermal expansion rate different from those of the sapphire substrate, which is heterogeneous with respect to the GaN layer. Further, since sapphire is an insulating material, on the surface of which no electrode can be formed, it is impossible to form a vertically-structured light emitting device including electrodes on the front and rear surfaces thereof. LEDs are hence receiving attention in which various types of GaN layers are formed on a gallium nitride (GaN) single crystal. Such a GaN monocrystalline substrate, which is of a homogeneous material with the GaN layers, allows for easy matching in the lattice constant and the thermal expansion rate, and is expected to have an increased performance compared to using a sapphire substrate. Patent Document 2, for example, discloses a free-standing n-type gallium nitride monocrystalline substrate with a thickness of 200 μm or more.

However, monocrystalline substrates are generally expensive, though having only a small area. In particular, while cost reduction in manufacturing LEDs using a large-area substrate has been demanded, it is not easy to mass-produce large-area monocrystalline substrates, and the manufacturing cost may contrariwise further increase. Hence, an inexpensive material has been required that can be substituted for gallium nitride or the like of such monocrystalline substrates. There have been proposed polycrystalline gallium nitride free-standing substrates that meet such a requirement. Patent Document 4, for example, discloses a polycrystalline gallium nitride free-standing substrate composed of multiple gallium nitride-based monocrystalline particles that have a particular crystal orientation in approximately the normal direction. Patent Document 3 also describes a polycrystalline gallium nitride free-standing substrate composed of multiple gallium nitride-based monocrystalline particles that have a particular crystal orientation in approximately the normal direction, in which the crystal orientations of the gallium nitride-based monocrystalline particles measured through inverse pole figure mapping of the electron back scatter diffraction (EBSD) on the substrate surface are distributed in a manner inclined at various angles with respect to the particular crystal orientation, with an average inclination angle of 1 to 10 degrees.

Patent Document 3 provides an oriented GaN free-standing substrate in which polycrystalline particles of which the substrate is composed are controlled to have an inclination angle (tilt angle) of 1 to 10 degrees and a light emitting device. This invention provides a polycrystalline gallium nitride free-standing substrate in which the surface can have a reduced defect density and a light emitting device using the polycrystalline gallium nitride free-standing substrate to have a high luminous efficiency.

Patent Document 5 provides a high-resistance and low-defect Zn doped GaN crystal and a method for manufacturing the crystal. The Na-flux method is used as a crystal growth method, in which Zn is added into a flux to cause growth of a GaN single crystal.

Patent Document 6 provides a method for manufacturing a gallium nitride single crystal. In a mixed flux of Na and an alkali or alkali-earth metal, gallium and nitrogen are reacted with each other to manufacture a gallium nitride single crystal. However, Patent Documents 5, 6 are intended to provide growth of a single crystal.

CITATION LIST

Patent Documents

Patent Document 1: JP 2012-184144 A
Patent Document 2: JP 2010-132556 A
Patent Document 3: WO 2015/151902 A1
Patent Document 4: JP 5770905 B
Patent Document 5: JP 5039813 B
Patent Document 6: JP 4001170 B

SUMMARY OF THE INVENTION

In the case that gallium nitride crystal is epitaxially grown by a flux method on an oriented polycrystalline sintered body, spaces tend to be generated between the adjacent polycrystalline particles. If such spaces are present, pits are generated on a surface of a processed wafer. When a device such as a LED or the like is provided on the gallium nitride crystal, the pits may be a cause of defects such as current leakage and a reduction of yield. If the devices are produced only in parts without the spaces, such problems can be avoided. As the size of the device becomes larger, it is more difficult to completely avoid the spaces, resulting in a cause of the reduction of yield of the devices.

An object of the present invention is, in a polycrystalline 13-group element nitride free-standing substrate composed of multiple monocrystalline particles that have a particular crystal orientation in approximately a normal direction, to reduce the pits on a top surface of the free-standing substrate.

The present invention provides a free-standing substrate of a polycrystalline nitride of a 13-group element comprising a plurality of monocrystalline particles having a particular crystal orientation in approximately the normal direction, wherein the polycrystalline nitride of the 13-group element comprises gallium nitride, aluminum nitride, indium nitride or a mixed crystal thereof, wherein the free-standing substrate has a top surface and a bottom surface and contains at least one of zinc and calcium, and wherein a root mean square roughness Rms of said top surface is 3.0 nm or lower.

The present invention further provides a light emitting device comprising:

the free-standing substrate; and a light emitting functional layer formed on the free-standing substrate and comprising at least one layer having a single crystal structure in approximately a normal direction and comprising a plurality of semiconductor monocrystalline particles.

For example, upon liquid phase epitaxial growth of a 13-group element nitride by the flux method, various elements were added into a flux and the density of the thus grown oriented polycrystalline 13-group element nitride crystal. As a method of the evaluation, a top surface of the oriented nitride of group 13 element is subjected to polishing, and the occurrence and sizes of pits opening at the top surface are observed by an optical microscope and the root mean roughness Rms of the top surface was measured.

As a result, the following were proved. That is, in the case that at least one of zinc and calcium is added into the oriented crystal of the nitride of the group 13 element, the density of the crystal was improved, and a number of the pits on the surface was reduced and the root mean roughness Rms was lowered. The mechanism of the reduction of the pits by containing zinc or calcium into the oriented crystal of the nitride of the group 13 element is not clear. However, in the case that zinc or calcium is contained, the particle size of the crystals of the oriented nitride of the group is larger than those in the case that nothing is added or another element (lithium, germanium or the like) is added. Therefore, it is speculated that the crystal growth in the lateral direction of the crystal particles is facilitated and the spaces between the crystal particles are embedded.

Then, according to the present invention, the number of the pits on the top surface of the free-standing substrate made of the oriented crystal of the nitride of the group 13 element is reduced. The defects of a semiconductor device (LED, power device or the like) using it as an underlying substrate can be prevented, resulting in improvement of the yield. Further, as the spaces in the free-standing substrate is reduced, optical scattering can be prevented to result in an improvement of performance in the production of a device such as an optical device.

Figure 1:
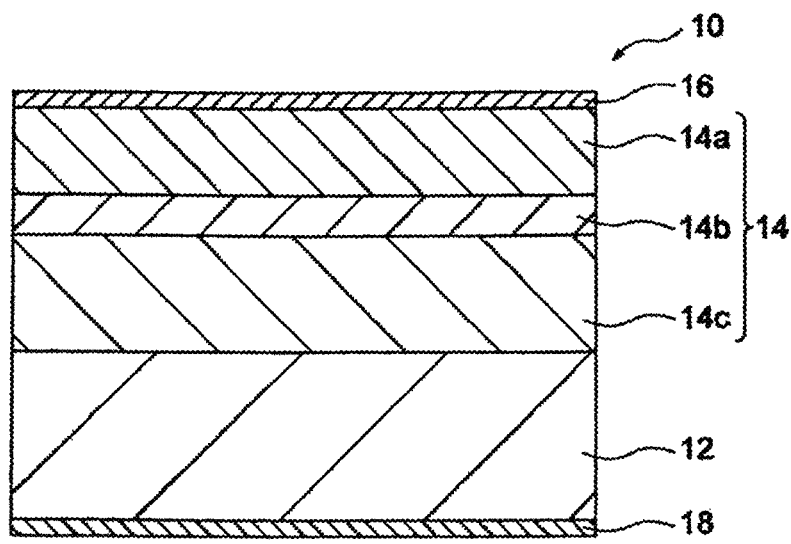
FIG. 1 is a schematic crosssectional view showing an example of a vertical type light-emitting device produced using a free-standing substrate of the present invention.

EMBODIMENTS FOR CARRYING OUT THE INVENTION (Free-Standing Substrate of Polycrystalline 13-Group Element Nitride)

A 13-group element nitride substrate according to the present invention can have a form of a free-standing substrate. The term "free-standing substrate" as used in the present invention means a substrate that cannot be deformed or broken under its own weight during handling and can be handled as a solid. The free-standing substrate of the present invention can be used not only as a substrate for various types of semiconductor devices such as light emitting devices, but also as a member or a layer other than the base material, such as an electrode (which may be a p-type electrode or an n-type electrode), a p-type layer, or an n-type layer. It is noted that in the following description, benefits of the present invention may be described by taking a light emitting device, one of major applications, as an example, and identical or similar benefits also apply to other semiconductor devices without losing the technical consistency.

The free-standing substrate of the present invention is composed of multiple 13-group element nitride monocrystalline particles that have a particular crystal orientation in approximately the normal direction.

The average cross-sectional diameter DT at the outermost surfaces of the monocrystalline particles exposed on the top surface of the free-standing substrate is preferably equal to or greater than 10 μm.

The multiple monocrystalline particles of which the free-standing substrate is composed have a particular crystal orientation in approximately the normal direction. The particular crystal orientation may be any crystal orientation (e.g. c-plane or a-plane) that a group 13 nitride can have. For example, if multiple monocrystalline particles are oriented in the c-plane in approximately the normal direction, each constituent particle at the top surface of the substrate is to be arranged with the c-axis set in approximately the normal direction (i.e. the c-plane exposed on the top surface of the substrate).

The free-standing substrate preferably has a single crystal structure in approximately the normal direction. In this case, the free-standing substrate can be considered to be a plate composed of multiple gallium nitride-based monocrystalline particles that have a single crystal structure in approximately the normal direction. That is, the free-standing substrate is composed of multiple monocrystalline particles linked two-dimensionally in the horizontal direction and therefore can have a monocrystalline structure in approximately the normal direction. Accordingly, the free-standing substrate is not a single crystal on the whole, but has a monocrystalline structure per local domain unit. With this arrangement, a device such as a light emitting feature or a photovoltaic cell, when fabricated, can show adequate characteristics. The reason, though not known, is presumed to be ascribed to the translucency and/or the light-extraction efficiency of the polycrystalline gallium nitride substrate.

Making the substrate of gallium nitride conductive through the introduction of p-type or n-type dopants also allows a light emitting device with a vertical structure to be achieved and thereby the luminance to be increased. Moreover, it is also possible to achieve a large-area surface-emitting device for use in surface-emitting illumination or the like at low cost.

Particularly, if the free-standing substrate of this aspect is used to fabricate a vertical LED structure, since the multiple monocrystalline particles of which the free-standing substrate is composed have a single crystal structure in approximately the normal direction, there exists no high-resistance particle boundary in the current path and, as a result, a preferable luminous efficiency is expected. In this regard, for the case of an oriented polycrystalline substrate, in which there exists particle boundaries also in the normal direction, even a vertical structure includes high-resistance particle boundaries in the current path and therefore may undergo reduction in the luminous efficiency. From these points of view, the free-standing substrate of this aspect can also be used preferably in such a vertical LED structure. Further, since there exists no particle boundary in the current path, the substrate can be applied not only to such a light emitting device, but also to, for example, a power device and a photovoltaic cell.

The multiple monocrystalline particles of which the free-standing substrate is composed preferably have crystal orientations generally aligned in approximately the normal direction. The phrase "crystal orientations generally aligned in approximately the normal direction" means that they are not necessarily limited to crystal orientations completely aligned in the normal direction, but may be crystal orientations aligned to some extent in the normal direction or its similar direction as long as a device such as a light emitting device using the free-standing substrate can ensure the desired device characteristics. In a process-derived expression, the monocrystalline particles can be considered to have a structure grown in a manner generally following the crystal orientation of an oriented polycrystalline sintered body that is used as a base material upon the manufacturing of the free-standing substrate. The phrase "structure grown in a manner generally following the crystal orientation of an oriented polycrystalline sintered body" means a structure provided by a crystal growth that is affected by the crystal orientation of the oriented polycrystalline sintered body and is not necessarily limited to a structure grown in a manner completely following the crystal orientation of the oriented polycrystalline sintered body, but may be a structure grown in a manner following, to some extent, the crystal orientation of the oriented polycrystalline sintered body as long as a device such as a light emitting device using the free-standing substrate can ensure the desired device characteristics. That is, this structure includes a structure that grows in a crystal orientation different from that of the oriented polycrystalline sintered body.

In this sense, the phrase "structure grown in a manner generally following the crystal orientation" can be translated into the phrase "structure grown in a manner generally derived from the crystal orientation", and the translation and the sense above also apply to similar phrases herein. Accordingly, such crystal growth is preferably epitaxial growth, but not limited thereto and various similar forms of crystal growth may be employed. In any case, the free-standing substrate, if thus grown, can have a structure in which the crystal orientations are generally aligned in approximately the normal direction.

The free-standing substrate preferably has a top surface and a bottom surface, and the crystal orientations of monocrystalline particles measured through inverse pole figure mapping of the electron back scatter diffraction (EBSD) on the top surface are distributed in a manner inclined at various angles with respect to a particular crystal orientation (e.g. c-axis or a-axis orientation), and the average of the inclination angles (average inclination angle) is equal to or greater than 0.1 degrees and 10 degrees or less.

It is noted that even when inverse pole figure mapping of the electron back scatter diffraction (EBSD) may be measured on the cross-section orthogonal to the top surface (plate face) of the free-standing substrate, it is possible to recognize that the monocrystalline particles of which the free-standing substrate is composed have particular crystal orientations in approximately the normal direction. However, the crystal orientations are non-orientation in a plate face direction orthogonal to the normal direction of the substrate. That is, in this structure, the monocrystalline particles have their respective crystal orientations only in approximately the normal direction, and the twist (crystal axis rotation) distribution of the monocrystalline particles is random axially in approximately the normal direction. With this structure, a device such as a light emitting feature or a photovoltaic cell, when fabricated using a free-standing substrate, can show adequate characteristics. The reason, though not known, is presumed to be ascribed to an effect of the light-extraction efficiency.

Accordingly, the free-standing substrate of the aspect above can be observed as a single crystal when viewed in the normal direction and can also be taken as a cluster of monocrystalline particles with a columnar structure in which particle boundaries are observed when viewed on the horizontal cross-section. Here, the term "columnar structure" does not mean only a typical vertically long columnar shape, but is defined as including various shapes such as a horizontally long shape, trapezoidal shape, and upside-down trapezoidal shape. It will be appreciated that the structure of the free-standing substrate is only required to have crystal orientations aligned to some extent in the normal direction or its similar direction as described above, and a columnar structure in a strict sense is not necessarily required. Such a columnar structure is considered to be due to the fact that the monocrystalline particles grow under the influence of the crystal orientation of the oriented polycrystalline sintered body used for manufacturing of the free-standing substrate as mentioned above. Thus, the average particle diameter of the cross-section (hereinafter referred to as average cross-sectional diameter) of each monocrystalline particle, which may have a columnar structure, may depend not only on film formation conditions, but also on the average particle diameter at the plate face of the oriented polycrystalline sintered body. If the free-standing substrate is used as part of a light emitting functional layer of a light emitting device, particle boundaries exist to degrade the light transmission in the cross-sectional direction and cause light to be scattered or reflected. This allows to expect an effect of an increase in the luminance by scattered light from the particle boundaries in the case of a light emitting device with a structure in which light is extracted in the normal direction.

If the free-standing substrate of the present invention is used to provide a vertical LED structure as described above, it is preferred that the top surface of the free-standing substrate on which a light emitting functional layer is to be formed and the bottom surface of the free-standing substrate on which an electrode is to be formed communicate with each other with no particle boundary therebetween. That is, the monocrystalline particles exposed on the top surface of the free-standing substrate preferably communicate with the bottom surface of the free-standing substrate with no particle boundary therebetween. Particle boundaries, if exist, would provide a resistance during energization, constituting a factor of reducing the luminous efficiency.

Incidentally, the average cross-sectional diameter DT at the outermost surfaces of the monocrystalline particles exposed on the top surface of the free-standing substrate is preferably different from the average cross-sectional diameter DB at the outermost surfaces of the monocrystalline particles exposed on the bottom surface of the free-standing substrate. This improves the crystalline nature of the free-standing substrate and its constituent particles. For example, a 13-group element nitride crystal, when epitaxially grown thorough gas phase and/or liquid phase, grows not only in the normal direction but also in the horizontal direction, though depending on film formation conditions. In this case, if there is a variation in the quality of particles from which the growth starts and/or a seed crystal fabricated thereon, the individual single crystals have their respective different growth rate and particles growing at a high rate may grow in a manner covering particles growing at a low rate. In the case of such a growth behavior, particles at the top surface of the substrate are more likely to have a large diameter than at the bottom surface of the substrate. In this case, slowly growing crystals stop growing in the middle, and particle boundaries can be observed also in the normal direction when viewed on one cross-section. However, particles exposed on the top surface of the substrate communicate with the bottom surface of the substrate with no particle boundary therebetween, providing no resistive phase when applying a current. In other words, since dominant ones of the particles exposed on the top surface of the substrate (the side opposite to that on which in contact with the oriented polycrystalline sintered body serving as a base substrate during manufacturing) after gallium nitride crystal film formation communicate with the bottom surface with no particle boundary therebetween, it is preferable to fabricate a light emitting functional layer on the top surface of the substrate in terms of an increase in the luminous efficiency of a vertically-structured LED. On the other hand, since the bottom surface of the substrate (the side on which in contact with the oriented polycrystalline sintered body serving as abase substrate during manufacturing) also has a mix of particles not communicating with the top surface of the substrate, fabricating a light emitting functional layer on the bottom surface of the substrate may cause a reduction in the luminous efficiency. Also, in the case of such a growth behavior, the growth is associated with an increase in the diameter as described above, the surface of the free-standing substrate at which the gallium nitride crystal has a larger particle diameter can be translated into the top surface of the substrate, while the surface having a smaller particle diameter can be translated into the bottom surface of the substrate. That is, in the free-standing substrate, it is preferable to fabricate a light emitting functional layer on the side where the 13-group element nitride crystal has a larger particle diameter (on the top surface of the substrate) in terms of an increase in the luminous efficiency of a vertically-structured LED. It is noted that if an oriented polycrystalline alumina sintered body with, for example, c-plane orientation is used as a base substrate, the top surface of the substrate (the side opposite to that on which in contact with the oriented polycrystalline alumina sintered body serving as a base substrate during manufacturing) serves as a 13-group element surface, while the bottom surface of the substrate (the surface which is in contact with the oriented polycrystalline alumina sintered body serving as a base substrate during manufacturing) serves as a nitrogen surface. That is, particles communicating with the bottom surface with no particle boundary therebetween dominate at the 13-group element surface of the free-standing substrate. It is therefore preferable to fabricate a light emitting functional layer on the 13-group element surface (on the top surface of the substrate) in terms of an increase in the luminous efficiency of a vertically-structured LED.

Accordingly, in the case of a growth behavior in which particles at the top surface of the substrate have a larger diameter than particles at the bottom surface of the substrate, that is, the average cross-sectional diameter of monocrystalline particles exposed on the top surface of the substrate is larger than the average cross-sectional diameter of monocrystalline particles exposed on the bottom surface of the substrate, the luminous efficiency preferably increases (this can be translated into the fact that the number of monocrystalline particles exposed on the top surface of the substrate is preferably smaller than the number of monocrystalline particles exposed on the bottom surface of the substrate).

Specifically, the ratio DT/DB between the average cross-sectional diameter at the outermost surface of the monocrystalline particles exposed on the top surface of the free-standing substrate (hereinafter referred to as average cross-sectional diameter DT at the top surface of the substrate) and the average cross-sectional diameter at the outermost surface of the monocrystalline particles exposed on the bottom surface of the free-standing substrate (hereinafter referred to as average cross-sectional diameter DB at the bottom surface of the substrate) is preferably greater than 1.0, preferably equal to or greater than 1.1, more preferably equal to or greater than 1.5, further preferably equal to or greater than 2.0, particularly preferably equal to or greater than 3.0, and most preferably equal to or greater than 5.0. However, if the ratio DT/DB is too high, the luminous efficiency may adversely decrease, and therefore the ratio is preferably equal to or smaller than 20 and more preferably equal to or smaller than 10. The cause of such a change in the luminous efficiency, though not known, is considered to be due to the fact that if the ratio DT/DB is high, an increase in the particle diameter causes a reduction in the particle boundary area not contributing to the emission of light or reduction in crystal defects. The cause of such a reduction in crystal defects, though also not known, can be considered to be due to the fact that defective particles grow at a low rate, while less-defective particles grow at a high rate. On the other hand, if the ratio DT/DB is too high, particles communicating between the top surface and the bottom surface of the substrate (i.e. particles exposed on the top surface of the substrate) have a smaller cross-sectional diameter in the vicinity of the bottom surface of the substrate. This may result in an insufficient current path to cause a reduction in the luminous efficiency, though details are not known.

It will be appreciated that if the columnar structures of which the free-standing substrate is composed, between which the interface has a reduced crystalline nature, are used as a light emitting functional layer of a light emitting device, the luminous efficiency may decrease and the emission wavelength may fluctuate and/or become broader. For this reason, the columnar structures preferably have a large average cross-sectional diameter. Specifically, the average cross-sectional diameter DT at the outermost surface of the monocrystalline particles exposed on the top surface of the free-standing substrate is equal to or greater than 10 µm, preferably equal to or greater than 20 µm, more preferably equal to or greater than 50 µm, particularly preferably equal to or greater than 70 µm, and most preferably equal to or greater than 100 µm. The upper limit of the average cross-sectional diameter of the monocrystalline particles at the outermost surface (top surface) of the free-standing substrate is realistically equal to or smaller than 1000 µm, more realistically equal to or smaller than 500 µm, still more realistically equal to or smaller than 200 µm, though not particularly limited thereto. Also, in order to fabricate monocrystalline particles of such an average cross-sectional diameter, the sintered particle diameter at the plate face of particles of which the oriented polycrystalline sintered body is composed for use in manufacturing the free-standing substrate is desirably equal to or greater than 10 µm, more desirably 10 µm to 1000 µm, further more desirably 10 µm to 800 µm, and particularly desirably 14 µm to 500 µm. Alternatively, bearing in mind that the average cross-sectional diameter of the monocrystalline particles at the outermost surface (top surface) of the free-standing substrate is larger than the average cross-sectional diameter at the bottom surface of the free-standing substrate, the sintered particle diameter at the plate face of particles of which the oriented polycrystalline sintered body is composed is desirably 10 µm to 100 µm and more desirably 14 µm to 70 µm.

According to the present invention, the nitride of the group 13 element forming the free-standing substrate contains at least one of zinc and calcium. It is thus possible to reduce the size and number of surface pits at the top surface of the respective single crystals. Then, it was found that the size and number of the pits at the surface can be evaluated by measuring the root mean roughness Rms.

That is, Rms means a numeral indicating the root mean roughness, which corresponds to a root of a value obtained by averaging squares of differences from an average line of the top surface of the free-standing substrate to a curve to be measured and calculated by the following formula.

$$\text{Rms} = \sqrt{\frac{1}{l}\int_0^l f(x)^2 dx}$$

The inventors have observed and counted the sizes and number of the pits on the top surface of the free-standing substrate by a microscope and, at the same time, measured the root mean roughness Rms of the same tip surface, and then compared them. It was then found that, as the sizes of the pits are large and the occurrence of the pits is high, the root mean roughness Rms becomes large. That is, in the case of an oriented crystal of a nitride of a group 13 element, the root mean roughness Rms at the surface is an appropriate indication reflecting the sizes and number of the pits.

On the viewpoint, it was variously studied the root mean roughness Rms of the top surface of the thus obtained free-standing substrate. It was thus found that, by incorporating at least one of zinc and calcium into the nitride of the Group 13 element forming the free-standing substrate, the sizes and number of the pits on the top surface can be considerably reduced. Specifically, it was found that the root mean roughness Rms of the top surface of the free-standing substrate can be lowered to 3.0 nm or lower.

Although the reasons are not clear, it may be considered as follows. That is, if each or both of zinc and calcium is added to the oriented polycrystalline nitride of the group 13 element, the growth of a part of monocrystalline particles is promoted, so that the particle size tends to be larger as it approaches the top surface (as the growth of the monocrystalline particles is proceeded). It is considered that spaces rarely occur at the top surface of the thus obtained polycrystalline nitride of the group 13 element to considerably reduce the surface pits.

Particularly, on the viewpoint of improving the yield of a device produced on the free-standing substrate, it is preferred that the pit size is small and the occurrence of the pits is low. In other words, from the viewpoint of improving the yield of the device produced on the free-standing substrate, the root mean roughness Rms is preferably low. As a result of the study of the present inventors, it is possible to produce a semiconductor device at a good yield in the case that the Rms of the top surface of the free-standing substrate is 3.0 nm or lower. On the viewpoint, the Rms of the top surface of the free-standing substrate is more preferably 2.0 nm or lower.

According to the present invention, at least one of zinc and calcium is added into the polycrystalline nitride of the group 13 element.

Here, in the case that zinc is contained in the polycrystalline nitride of the group 13 element, from the viewpoint of the present invention, the concentration of zinc may preferably be $1 \times 10^{17}$ atoms/cm$^3$ or higher and more preferably be $1 \times 10^{18}$ atoms/cm$^3$ or higher. Further, for preventing the reduction of the crystal growth rate, the concentration of zinc may preferably be $1 \times 10^{20}$ atoms/cm$^3$ or lower and more preferably be $5 \times 10^{19}$ atoms/cm$^3$ or lower.

Further, in the case that calcium is contained in the polycrystalline nitride of the group 13 element, on the viewpoint of the present invention, the concentration of calcium may preferably be $5 \times 10^{15}$ atoms/cm$^3$ or higher and more preferably be $1 \times 10^{16}$ atoms/cm$^3$ or higher. Further, for preventing the spontaneous nuclei generation in melt composition, the concentration of calcium may preferably be $1 \times 10^{19}$ atoms/cm$^3$ or lower and more preferably be $5 \times 10^{18}$ atoms/cm$^3$ or lower.

By incorporating zinc into the free-standing substrate, the specific resistivities of the free-standing substrate in the direction of thickness and in a plane, it is possible to provide a free-standing substrate suitable for applications requiring a high electrical resistance, For example, it is possible to provide a free-standing substrate whose specific resistivity in the direction of a plane is 50 Ω·cm or higher and $1 \times 10^7$ Ω·cm or lower. Further, the specific resistivity can be made 500 Ω·cm or higher and $1 \times 10^5$ Ω·cm or lower.

Further, the specific resistivity of the free-standing substrate in the direction of thickness can be made 5 Ω·cm or higher and $1 \times 10^7$ Ω·cm or lower. Further, the specific resistivity can be made 100 Ω·cm or higher and $5 \times 10^4$ Ω·cm or lower.

By incorporating zinc into the free-standing substrate, the specific resistivity of the free-standing substrate can be made higher as a whole and, at the same time, a ratio of the specific resistivity of the free-standing substrate in a plane with respect to a specific resistivity of the free-standing substrate in the direction of thickness (the specific resistivity in the plane/the specific resistivity in the direction of thickness) can be made lower. Specifically, the ratio can be made 1.3 or higher and 15 or lower.

In addition to zinc and calcium, the polycrystalline 13-group element nitride of which the free-standing substrate is composed may be further doped with an n-type dopant or p-type dopant and, in this case, the polycrystalline group 13 nitride can be used as a member or a layer other than the base material, such as a p-type electrode, an n-type electrode, a p-type layer, or an n-type layer. A preferable example of p-type dopants may be one type or more selected from the group consisting of beryllium (Be), magnesium (Mg), strontium (Sr), and cadmium (Cd). A preferable example of n-type dopants may be one type or more selected from the group consisting of silicon (Si), germanium (Ge), tin (Sn), and oxygen (O).

The monocrystalline particles of which the free-standing substrate is composed may be a mixed crystal to control the bandgap. The polycrystalline 13-group element nitride of which the free-standing substrate is composed may preferably consist of gallium nitride mixed with one type or more of crystals selected from the group consisting of AlN and InN and may be doped with p-type dopants or n-type dopants.

For example, $Al_xGa_{1-x}N$, a mixed crystal of gallium nitride and AlN, can be doped with Mg for use as a p-type substrate, while $Al_xGa_{1-x}N$ can be doped with Si for use as an n-type substrate. If the free-standing substrate is used as a light emitting functional layer of a light emitting device, a mixed crystal of gallium nitride and AlN can widen the bandgap and thereby shift the emission wavelength toward the high energy side. A mixed crystal ($In_xGa_{1-x}N$) of gallium nitride and InN may also be employed to narrow the bandgap and thereby shift the emission wavelength toward the low energy side.

It is noted that the 13-group element nitride of which the free-standing substrate is composed is preferably a gallium nitride crystal or a gallium nitride-based mixed crystal. The gallium nitride-based mixed crystal is represented by $Al_xGa_{1-x}N$ or $In_xGa_{1-x}N$ as described above and, in this case, x is preferably 0.5 or less and more preferably 0.2 or less.

The free-standing substrate preferably has a diameter of 50.8 mm (2 inches) or more in size, more preferably a diameter of 100 mm (4 inches) or more, and further preferably a diameter of 200 mm (8 inches) or more. The larger the size of the polycrystalline gallium nitride free-standing substrate, the more devices can be fabricated thereon, which is preferred in terms of manufacturing cost and also in terms of application for surface-emitting devices because the degree of freedom of the device area increases and thereby a wide range of application such as surface-emitting illuminations can be achieved, so that no upper limit should be set on the area or the size. It is noted that the free-standing substrate preferably has a circular or substantially circular shape in a top view, but is not limited thereto. The substrate, if not a circular or substantially circular shape, preferably has an area of 2026 mm$^2$ or more, more preferably 7850 mm$^2$ or more, and further preferably 31400 mm$^2$ or more. It will be appreciated that for applications not requiring a large area, the substrate may have an area smaller than the range above, for example, a diameter of 50.8 mm (2 inches) or less, in area terms, 2026 mm$^2$ or less.

The free-standing substrate must have a thickness that allows for free standing and preferably has a thickness of 20 μm or more, more preferably 100 μm or more, and further preferably 300 μm or more. No upper limit should be set on the thickness of the free-standing substrate, but it is realistic to have a thickness of 3000 μm or less in terms of manufacturing cost.

The aspect ratio T/DT, which is defined as a ratio between the thickness T of the free-standing substrate and the average cross-sectional diameter DT at the outermost surfaces of the monocrystalline particles exposed on the top surface of the free-standing substrate, is preferably equal to or greater than 0.7, more preferably equal to or greater than 1.0, and further preferably equal to or greater than 3.0. This aspect ratio is preferred in terms of an increase in the luminous efficiency for the case of an LED. The cause of such an increase in the luminous efficiency is considered to be due to the fact that particles with a higher aspect ratio have a low defect density in gallium nitride and show an increased light-extraction efficiency, though details are not known.

As described heretofore, in terms of an increase in the luminous efficiency, (1) a light emitting functional layer is preferably fabricated on the top surface of the free-standing substrate (the side opposite to that on which is in contact with the oriented polycrystalline sintered body serving as a base substrate during manufacturing), (2) the ratio DT/DB between the average cross-sectional diameter DT at the top surface of the free-standing substrate and the average cross-sectional diameter DB at the bottom surface of the substrate preferably has a moderate value, (3) the average cross-sectional diameter of particles of which the free-standing substrate is composed at the outermost surface of the substrate is preferably large, and (4) the aspect ratio T/DT of particles of which the free-standing substrate is composed is preferably high. In terms of (3) and (4) above, it is preferred that the average cross-sectional diameter is large and the aspect ratio is high, in other words, it is preferred that the average cross-sectional diameter at the top surface of the substrate is large and the polycrystalline 13-group element nitride is thick. Also, in terms of free standing, the free-standing substrate preferably has a thickness of 20 μm or more, more preferably 100 μm or more, and further preferably 300 μm or more. However, as mentioned above, an increase in the thickness of the polycrystalline 13-group element nitride is not preferred in terms of cost, and the nitride is preferably thin as long as it can freely stand. That is, the free-standing substrate realistically has a thickness of 3000 μm or less, preferably 600 μm or less, and more preferably 300 μm or less. Accordingly, in terms of both free standing as well as an increase in the luminous efficiency and cost, the thickness is preferably about 50 to 500 μm and further preferably about 300 to 500 μm.

(Manufacturing Method)

The free-standing substrate of the present invention can be made as follows.

(1) An oriented polycrystalline sintered body is prepared.
(2) On the oriented polycrystalline sintered body is provided a seed crystal layer of gallium nitride so that its crystalline orientation is substantially aligned to the crystalline orientation of the oriented polycrystalline sintered body.
(3) On the seed crystal layer, a layer is formed composed of a gallium nitride series crystal having a thickness of 20 μm or larger, so that its crystalline orientation substantially conforms to the crystalline orientation of the seed crystal layer.
(4) The oriented polycrystalline sintered body is removed to obtain the free-standing substrate.

(Method for Manufacturing an Oriented Polycrystalline Sintered Body)

The oriented polycrystalline sintered body used as a base material in manufacturing of a free-standing substrate according to the present invention may be manufactured by any manufacturing method without particular limitation. It may be fabricated, for example, based on the method described in Patent Document 3 (WO 2015/151902 A1).

It will be appreciated that the method for manufacturing an oriented polycrystalline sintered body according to a preferred aspect of the present invention includes the steps of (a) fabricating a laminated body in which a fine raw material powder layer and a plate-like raw material powder layer with the plate face of plate-like raw material particles arranged to follow the surface of the fine raw material powder layer are laminated alternately and (b) sintering the laminated body.

The fine raw material powder layer used in step (a) is a cluster of fine raw material particles. The fine raw material powder has an average particle diameter smaller than that of the plate-like raw material powder. The fine raw material powder layer may be formed by molding fine raw material powder or formed by molding fine raw material powder including an additive. The additive may be, for example, a sintering agent, graphite, binder, plasticizer, dispersant, or a dispersion medium. The molding method may be, for example, tape molding, extrusion molding, cast molding, injection molding, or uniaxial press molding, though not particularly limited thereto. The fine raw material powder layer preferably has a thickness of 5 to 100 μm and more preferably 20 to 60 μm.

The plate-like raw material powder layer used in step (a) is a cluster of plate-like raw material particles. The plate-like raw material powder preferably has an aspect ratio of 3 or more. The aspect ratio is defined by average particle diameter/average thickness. Here, the average particle diameter is the average length of the major axis of the particle plate face and the average thickness is the average length of the mirror axis of each particle. These values are determined by observing any 100 particles in the plate-like raw material powder with a scanning electron microscope (SEM). In terms of high orientation of the oriented sintered body, the plate-like raw material powder preferably has a large average particle diameter, preferably equal to or greater than 1.5 μm, more preferably equal to or greater than 5 μm, further preferably equal to or greater than 10 μm, and particularly preferably equal to or greater than 15 μm. However, in terms of densification, it is preferably small, preferably equal to or smaller than 30 μm. Thus, in terms of both a high orientation and densification, the average particle diameter is preferably 1.5 μm to 30 μm. The plate-like raw material powder layer may be formed of a plate-like raw material powder or formed of a plate-like material powder including an additive. The additive may be, for example, a sintering agent, graphite, binder, plasticizer, dispersant, or a dispersion medium. In the plate-like raw material powder layer, the plate face of the plate-like raw material particles forming the plate-like raw material powder is arranged in a manner following the surface of the fine raw material powder layer. The plate-like raw material powder is preferably composed of single crystals. In the case of non-single particles, the degree of orientation and/or the inclination angle may be degraded. In order to singulate particles, at least one of classification processing, crush processing, and elutriation processing is only required, but all of them are preferably employed. The classification processing or crush processing is preferably employed in case of aggregation or the like. The classification processing includes, for example, air flow classification. The crush processing includes, for example, pot crushing and wet atomization. The elutriation processing is preferably employed in case of the incorporation of fine particulate powder.

The laminated body fabricated in step (a) is formed by laminating a fine raw material powder layer and a plate-like raw material powder layer alternately. Upon fabrication of the laminated body, a one-side processed body may be fabricated by coating one side of a molded body of fine raw material powder entirely or partially with a plate-like raw material powder layer and, using the one-side processed body, a laminated body may be fabricated. Alternatively, a double-side processed body may be fabricated by coating both sides of a molded body of fine raw material powder entirely or partially with a plate-like raw material powder layer and, using the double-side processed body and an unprocessed molded body, a laminated body may be fabricated.

The one-side processed body or the double-side processed body may be fabricated by laminating one side or the both sides of a molded body of fine raw material powder with a molded body of plate-like raw material powder with a thickness smaller than that of the molded body. In this case, the molded body of the plate-like raw material powder may be molded by applying a shear force with, for example, tape molding or printing so that the plate face of the plate-like raw material particles follows the surface of the molded body. Alternatively, the one-side processed body or the double-side processed body may be fabricated by printing, spray coating, spin coating, or dip coating plate-like raw material powder dispersion onto one side or both sides of a molded body of fine raw material powder. Spray coating, spin coating, or dip coating causes the plate face of the plate-like raw material particles to follow the surface of the molded body without forcibly applying a shear force. A few of the plate-like raw material particles arranged at the surface of the molded body may overlap with each other, but preferably do not overlap with the other plate-like raw material particles.

In the case of utilizing such a one-side processed body, it is only required to stack one-side processed bodies such that the fine raw material powder layer and the plate-like raw material powder layer are laminated alternately. In the case of utilizing such a double-side processed body, it is only required to stack double-side processed bodies and unprocessed molded bodies of fine raw material powder alternately. It is noted that both a one-side processed body and a double-side processed body may be utilized to fabricate a laminated body or a one-side processed body, a double-side processed body, and an unprocessed molded body may be utilized to fabricate a laminated body.

In step (b), the laminated body is sintered. In this case, the sintering method is preferably pressure sintering or hydrogen sintering, though not particularly limited thereto. The pressure sintering includes, for example, hot-press sintering and HIP sintering. It is noted that atmospheric pre-sintering may be performed prior to the pressure sintering. A capsule method may be used to perform the HIP sintering. The pressure in the case of hot-press sintering is preferably 50 kgf/cm$^2$ or higher and more preferably 200 kgf/cm$^2$ or higher. The pressure in the case of HIP sintering is preferably 1000 kgf/cm$^2$ or higher and more preferably 2000 kgf/cm$^2$ or higher. The sintering atmosphere is preferably under an inert gas such as atmospheric air, nitrogen, Ar, or vacuum atmosphere, particularly preferably under a nitrogen or Ar atmosphere, and most preferably under a nitrogen atmosphere, though not particularly limited thereto.

The laminated body is formed by alternately laminating a fine raw material powder layer of a cluster of fine raw material particles and a plate-like raw material powder layer with the plate face of plate-like raw material particles arranged along the surface of the fine raw material powder layer. When the laminated body is sintered, the plate-like raw material particles form a seed crystal (template), while the fine raw material particles form a matrix, in which the template grows homo-epitaxially while taking in the matrix. Thus, the resulting sintered body is an oriented sintered body, which has a high degree of orientation and small inclination angle. The degree of orientation and the inclination angle depend on the coverage rate at which the plate-like raw material powder covers the surface of the fine raw material powder layer. When the coverage rate is 1 to 60% (preferably 1 to 20%, further preferably 3 to 20%), the degree of orientation is high and the inclination angle is small. The degree of orientation and the inclination angle also depend on the thickness of the fine raw material powder layer. When the thickness of the fine raw material powder layer is 10 to 100 μm (more preferably 10 to 100 μm, further preferably 20 to 60 μm), the degree of orientation is high and the inclination angle is small. The degree of orientation here indicates the degree of c-plane orientation obtained by the Lotgering method using an X-ray diffraction profile, while the inclination angle uses an XRC half-value width (XRC-FWHM).

Although there is no particular limitation on the composition of the oriented polycrystalline sintered body, one type selected from an oriented polycrystalline alumina sintered body, an oriented polycrystalline zinc oxide sintered body, and an oriented polycrystalline aluminum nitride sintered body is preferred. Accordingly, the main component of the fine raw material powder and the plate-like raw material powder may be, for example, alumina, ZnO, AlN and, among these, alumina is preferred. If the main component is alumina, the sintering temperature (topmost temperature) is preferably 1850 to 2050 degrees C. and more preferably 1900 to 2000 degrees C. It is noted that the term "main component" means a component with a mass proportion of 50% (preferably 60%, more preferably 70%, and further preferably 80%) or more to the entire powder.

The oriented sintered body obtained by the manufacturing method of this aspect has a high degree of c-plane orientation and a small inclination angle. For example, it is possible to achieve a degree of c-plane orientation of 80% or higher (preferably 90% or higher and more preferably 96% or higher) obtained by the Lotgering method using an X-ray diffraction profile. As for the inclination angle, it is also possible to achieve an XRC-FWHM of 5 degrees or less (preferably 2.5 degrees or less, more preferably 1.5 degrees or less, and further preferably 1.0 degree or less) measured using an X-ray rocking curve method.

(Formation of Seed Crystal Layer)

A seed crystal layer made of gallium nitride is formed on the oriented polycrystalline sintered body, so that its crystalline orientation is substantially aligned to the crystal orientation of the oriented polycrystalline sintered body. The phrase "it is formed in a manner substantially aligned with the crystal orientation of the oriented polycrystalline sintered body" means a structure provided by crystal growth that is affected by the crystal orientation of the oriented polycrystalline sintered body and is not necessarily limited to a structure grown in a manner completely following the crystal orientation of the oriented polycrystalline sintered body. This structure includes a structure that grows in a crystal orientation different from that of the oriented polycrystalline sintered body. Although the method of forming the seed crystal layer is not particularly limited, preferable are vapor phase processes such as MOCVD (metal organic chemical vapor deposition), MBE (molecular beam epitaxy), HVPE (hydride vapor epitaxy), sputtering and the like, liquid phase processes such as Na flux method, ammono-thermal method, hydrothermal method and sol-gel method, a powder method utilizing the solid phase growth of powder, and combinations thereof. For example, in the case that the seed crystal layer is formed by a MOCVD method, preferably, a low-temperature GaN layer is deposited in 20 to 50 nm at 450 to 550 degrees C. and a GaN film is then deposited in a thickness of 2 to 4 μm at 1000 to 1200 degrees C.

(Formation of Gallium Nitride Series Crystal Layer)

On the seed crystal layer, a layer of a gallium nitride series crystal and having thickness of 20 μm or larger is provided so that its crystalline orientation is substantially aligned with the crystal orientation of the seed crystal layer. The method of forming the layer composed of the gallium nitride series crystal is not particularly limited as long as its crystalline orientation is substantially aligned with the crystal orientation of the oriented polycrystalline sintered body and/or seed crystal layer. Preferable are vapor phase methods such as MOCVD, HVPE and the like, liquid phase methods such as a Na flux method, ammono-thermal method, hydrothermal method and sol-gel method, a powder method utilizing the solid phase growth of powder, and combinations thereof. It is particularly preferred that to it be performed by a Na flux method. According to the Na flux method, it is possible to efficiently produce a thick gallium nitride crystal layer having a good crystallinity on the seed crystal layer. In the case that the gallium nitride series crystal layer is formed by a Na flux method, preferably, it is a filled melt composition containing gallium metal, sodium metal and a dopant if desired in a crucible setting a seed crystal substrate, the temperature and pressure are raised to 830 to 910 degrees C. and 3.5 to 4.5 MPa under a nitrogen atmosphere, and the crucible is rotated while the temperature and pressure are maintained. Although the retention time is different depending on a target film thickness, it may be made about 10 to 100 hours. Further, the thus obtained gallium nitride crystal by a Na flux method is preferably ground by grinding stones to flatten the plate surface, and the plate surface is then flattened by lapping using diamond abrasives.

(Removal of Oriented Polycrystalline Sintered Body)

The oriented polycrystalline sintered body can be removed to obtain a free-standing substrate composed of a group 13 nitride. Although there is no particular limitation on the method for removing the oriented polycrystalline sintered body, grinding processing, chemical etching, interface heating through laser irradiation on the oriented sintered body side (laser lift-off), spontaneous peeling utilizing the thermal expansion difference during temperature rise, or the like may be employed.

(Light Emitting Device and Method for Manufacturing the Same)

The above-described free-standing substrate according to the present invention can be used to fabricate a high-quality light emitting device. As mentioned above, constructing a light emitting device using the free-standing substrate according to the present invention allows the obtaining of a high luminous efficiency. The structure and fabricating method of the light emitting device using the free-standing substrate of the present invention is not particularly limited. Typically, the light emitting device is fabricated by providing a light emitting functional layer on the free-standing substrate, and the light emitting functional layer is preferably formed to have a crystal orientation generally following the crystal orientation of the free-standing substrate by forming one or more layers composed of multiple semiconductor monocrystalline particles that have a single crystal structure in approximately the normal direction. It will be appreciated that the light emitting device may be fabricated by utilizing the polycrystalline free-standing substrate as a member or a layer other than the base material, such as an electrode (which may be a p-type electrode or an n-type electrode), a p-type layer, or an n-type layer. The device size is not particularly limited, and a small device of 5 mm×5 mm or smaller or a surface-emitting device of 10 cm×10 cm or larger may be provided.

FIG. 1 schematically shows the layer configuration of a light emitting device according to an aspect of the present invention. The light emitting device 10 shown in FIG. 1 includes a free-standing substrate 12 and a light emitting functional layer 14 formed on the substrate. The light emitting functional layer 14 has at least one layer having a single crystal structure in approximately the normal direction and is composed of multiple semiconductor monocrystalline particles. The light emitting functional layer 14 provides a light emission based on the principle of light emitting devices such as LEDs by appropriately providing electrodes thereon and applying a voltage therebetween. In particular, using the polycrystalline free-standing substrate 12 of the present invention allows for obtaining a light emitting device having a luminous efficiency equal to that for the case where a monocrystalline substrate is used, whereby it is possible to achieve a significant cost reduction. Making the free-standing substrate of a 13-group element nitride made conductive through the introduction of p-type or n-type dopants also allows for a light emitting device with a vertical structure to be achieved and thereby the luminance to be increased. Moreover, it is also possible to achieve a large-area surface-emitting device at a low cost.

The light emitting functional layer 14 is formed on the substrate 12. The light emitting functional layer 14 may be provided entirely or partially on the substrate 12 or may be provided entirely or partially on a buffer layer to be described hereinafter if formed on the substrate 12. The light emitting functional layer 14 has one or more layers composed of multiple semiconductor monocrystalline particles that have a single crystal structure in approximately the normal direction and may take one of various known layer configurations that provides a light emission based on the principle of light emitting devices as represented by LEDs by appropriately providing electrodes and/or phosphors thereon and applying a voltage therebetween. Accordingly, the light emitting functional layer 14 may emit visible light of, for example, blue and red or may emit ultraviolet light without or with visible light. The light emitting functional layer 14 preferably forms at least part of a light emitting device that exploits a p-n junction and the p-n junction may include an active layer 14b between a p-type layer 14a and an n-type layer 14c, as shown in FIG. 1. In this case, a double heterojunction or a single heterojunction (hereinafter referred to collectively as heterojunction) may be employed in which the active layer has a bandgap smaller than that of the p-type layer and/or the n-type layer. A quantum well structure in which the active layer is thin may also be taken as one form of p-type layer/active layer/n-type layer.

A double heterojunction in which the active layer has a bandgap smaller than that of the p-type layer and the n-type layer should obviously be employed to obtain a quantum well. Many quantum well structures may also be stacked to provide a multiple quantum well (MQW) structure. These structures allow a higher luminous efficiency compared to a p-n junction. The light emitting functional layer 14 thus preferably includes a p-n junction, a heterojunction, and/or a quantum well junction having a light emitting feature.

Accordingly, one or more layers forming the light emitting functional layer 14 can include at least one or more selected from the group consisting of the n-type layer with n-type dopants doped therein, the p-type layer with p-type dopants doped therein, and the active layer. In the n-type layer, the p-type layer, and the active layer (if it exists), the main component may be of the same material or may be of respectively different materials.

The material of each layer forming the light emitting functional layer 14 is not particularly limited as long as grown in a manner generally following the crystal orientation of the free-standing substrate and having a light emitting feature, but preferably includes one type or more selected from gallium nitride (GaN)-based material, zinc oxide (ZnO)-based material, and aluminum nitride (AlN)-based material as the main component and may appropriately contain dopants for controlling to be p-type or n-type. Gallium nitride (GaN)-based material is particularly preferable, which is the same type of material as in the free-standing substrate. The material of the light emitting functional layer 14 may be a mixed crystal with, for example, AlN, InN, etc. solid-solved in GaN to control the bandgap. As mentioned in the last paragraph, the light emitting functional layer 14 may employ a heterojunction composed of multiple types of material systems. For example, the p-type layer may employ gallium nitride (GaN)-based material, while the n-type layer may employ zinc oxide (ZnO)-based material. Alternatively, the p-type layer may employ zinc oxide (ZnO)-based material, while the active layer and the n-type layer may employ gallium nitride (GaN)-based material, the combination of materials being not particularly limited.

Each layer forming the light emitting functional layer 14 has a single crystal structure in approximately the normal direction and are composed of multiple semiconductor monocrystalline particles. That is, each layer is composed of multiple semiconductor monocrystalline particles linked two-dimensionally in the horizontal direction and therefore has a single crystal structure in approximately the normal direction. Accordingly, each layer of the light emitting functional layer 14 is not a single crystal on the whole, but has a single crystal structure per local domain unit, which allows to have a crystalline nature that is high enough to ensure a light emitting feature.

The semiconductor monocrystalline particles of which each layer of the light emitting functional layer 14 is composed preferably have a structure grown in a manner generally following the crystal orientation of the free-standing substrate, that is, the substrate 12. The phrase "structure grown in a manner generally following the crystal orientation of polycrystalline 13-group element nitride of the free-standing substrate" means a structure provided by crystal growth that is affected by the crystal orientation of the polycrystalline 13-group element nitride free-standing substrate and is not necessarily limited to a structure grown in a manner completely following the crystal orientation of the free-standing substrate, but may be a structure grown in a manner following, to some extent, the crystal orientation of the free-standing substrate as long as capable of ensuring a desired light emitting feature. That is, this structure includes a structure that grows in a crystal orientation different from that of the oriented polycrystalline sintered body. In this sense, the phrase "structure grown in a manner generally following the crystal orientation" can be translated into the phrase "structure grown in a manner generally derived from the crystal orientation". Accordingly, such crystal growth is preferably epitaxial growth, but not limited thereto and various similar forms of crystal growth may be employed. In particular, if each layer including, for example, the n-type layer, the active layer, and the p-type layer grows in the same crystal orientation as the free-standing substrate, a structure in which the crystal orientation is generally aligned in approximately the normal direction is provided also from the free-standing substrate to between the layers of the light emitting functional layer, whereby it is possible to have a good light-emitting property. That is, if the light emitting functional layer 14 is also grown in a manner generally following the crystal orientation of the free-standing substrate 12, the orientation is generally constant in the vertical direction of the substrate. This provides a state equal to that for a single crystal in the normal direction, and if the free-standing substrate is added with n-type dopants, a vertical light emitting device can be obtained with the free-standing substrate serving as a cathode, while if the polycrystalline gallium nitride free-standing substrate is added with p-type dopants, a vertical light emitting device can be obtained with the free-standing substrate serving as an anode.

If each layer including, for example, at least the n-type layer, the active layer, and the p-type layer forming the light emitting functional layer 14 grows in the same crystal orientation, each layer of the light emitting functional layer 14 can be observed as a single crystal when viewed in the normal direction and can also be taken as a cluster of semiconductor monocrystalline particles with a columnar structure in which particle boundaries are observed when viewed on the horizontal cross-section. Here, the term "columnar structure" does not mean only a typical vertically long columnar shape, but is defined as including various shapes such as horizontally long shape, trapezoidal shape, and upside-down trapezoidal shape. It will be appreciated that the structure of each layer is only required to be grown in a manner following, to some extent, the crystal orientation of the free-standing substrate as described above, and a columnar structure in a strict sense is not necessarily required. Such a columnar structure is considered to be due to the fact that the semiconductor monocrystalline particles grow under the influence of the crystal orientation of the free-standing substrate 12 as mentioned above. Thus, the average particle diameter of the cross-section (hereinafter referred to as average cross-sectional diameter) of each semiconductor monocrystalline particle, which may have a columnar structure, may depend not only on film formation conditions, but also on the average particle diameter at the plate face of the free-standing substrate. The interfaces in the columnar structure forming the light emitting functional layer affect the luminous efficiency and the emission wavelength, particle boundaries exist to degrade light transmission in the cross-sectional direction and cause light to be scattered or reflected. This allows an expectation of an increase in the luminance by scattered light from the particle boundaries in the case of a structure in which light is extracted in the normal direction.

It will be appreciated that the interfaces between the columnar structures forming the light emitting functional layer 14 have a reduced crystalline nature, and therefore the luminous efficiency may decrease and the emission wavelength may fluctuate and/or become broader. For this reason, the columnar structures preferably have a large average cross-sectional diameter. The average cross-sectional diameter of the semiconductor monocrystalline particles at the outermost surface of the light emitting functional layer 14 is preferably equal to or greater than 10 µm, more preferably equal to or greater than 15 µm, further preferably equal to or greater than 20 µm, particularly preferably equal to or greater than 50 µm, and most preferably equal to or greater than 70 µm. The upper limit of the average cross-sectional diameter is realistically equal to or smaller than 1000 µm, more realistically equal to or smaller than 500 µm, still more realistically equal to or smaller than 200 µm, though not particularly limited thereto. Also, in order to fabricate semiconductor monocrystalline particles having such an average cross-sectional diameter, the monocrystalline particle substrate forming the free-standing substrate desirably has at its outermost surface an average cross-sectional diameter of 10 µm to 1000 µm and more desirably equal to or greater than 10 µm.

If a non-gallium nitride (GaN)-based material is used partially or entirely in the light emitting functional layer 14, a buffer layer for suppressing a reaction may be provided between the free-standing substrate 12 and the light emitting functional layer 14. The main component of such a buffer layer preferably includes one or more selected from zinc oxide (ZnO)-based material and aluminum nitride (AlN)-based material and may appropriately contain dopants for being p-type or n-type, though not particularly limited.

Each layer forming the light emitting functional layer 14 is preferably composed of a 13-group element nitride. For example, an n-type gallium nitride layer and a p-type gallium nitride layer may be grown in this order on the free-standing substrate 12 and the order of lamination of the p-type gallium nitride layer and the n-type gallium nitride layer may be reversed. A preferable example of p-type dopants to be used in the p-type gallium nitride layer may be one or more selected from the group consisting of beryllium (Be), magnesium (Mg), calcium (Ca), strontium (Sr), zinc (Zn), and cadmium (Cd). A preferable example of n-type dopants to be used in the n-type gallium nitride layer may be one or more selected from the group consisting of silicon (Si), germanium (Ge), tin (Sn), and oxygen (O). The p-type gallium nitride layer and/or the n-type gallium nitride layer may consist of gallium nitride mixed with one or more crystals selected from the group consisting of AlN and InN, and the p-type layer and/or the n-type layer may be formed by doping the mixed crystal gallium nitride with p-type dopants or n-type dopants. For example, $Al_xGa_{1-x}N$, a mixed crystal of gallium nitride and AlN, can be doped with Mg for use as the p-type layer, while $Al_xGa_{1-x}N$ can be doped with Si for use as the n-type layer. Such a mixed crystal of gallium nitride and AlN can widen the bandgap and thereby shift the emission wavelength toward the high energy side. A mixed crystal of gallium nitride and InN may also be employed to narrow the bandgap and thereby shift the emission wavelength toward the low energy side. Between the p-type gallium nitride layer and the n-type gallium nitride layer, there may be provided an active layer of a mixed crystal of one type or more selected from the group consisting of GaN with a bandgap smaller than that of either of the layers or AlN and InN, and GaN. The active layer has a double heterojunction structure with the p-type layer and the n-type layer, and a thin version of the active layer corresponds to a light emitting device having a quantum well structure as one aspect of a p-n junction, whereby the luminous efficiency can be further increased. The active layer may also be composed of a mixed crystal of one or more selected from the group consisting of GaN with a bandgap smaller than that of one of the layers or AlN and InN, and GaN. Such a single heterojunction can also further increase the luminous efficiency. The gallium nitride-based buffer layer may be composed of undoped GaN or n-type or p-type doped GaN or may be mixed with one or more crystals selected from the group consisting of AlN, InN, or GaN with a similar lattice constant, AlN, and InN.

It will be appreciated that the light emitting functional layer 14 may be composed of multiple material systems selected from gallium nitride (GaN)-based material, zinc oxide (ZnO)-based material, and aluminum nitride (AlN)-based material. For example, a p-type gallium nitride layer and an n-type zinc oxide layer may be grown on the polycrystalline gallium nitride free-standing substrate 12 and the order of lamination of the p-type gallium nitride layer and the n-type zinc oxide layer may be reversed. If the polycrystalline gallium nitride free-standing substrate 12 is used as part of the light emitting functional layer 14, an n-type or p-type zinc oxide layer may be formed. A preferable example of p-type dopants to be used in the p-type zinc oxide layer may be one or more selected from the group consisting of nitrogen (N), phosphorus (P), arsenic (As), carbon (C), lithium (Li), sodium (Na), potassium (K), silver (Ag), and copper (Cu). A preferable example of n-type dopants to be used in the n-type zinc oxide layer may be one or more selected from the group consisting of aluminum (Al), gallium (Ga), indium (In), boron (B), fluorine (F), chlorine (Cl), bromine (Br), iodine (I), and silicon (Si).

The film formation method for the light emitting functional layer 14 and the buffer layer is preferably exemplified by a gas phase method such as MOCVD, MBE, HVPE, and sputtering, a liquid phase method such as a Na flux method, ammono-thermal method, hydrothermal method, and sol-gel method, a powder method utilizing the solid phase growth of powder, and combinations thereof, though is not particularly limited as long as it is grown in a manner generally following the crystal orientation of the polycrystalline gallium nitride free-standing substrate. If the light emitting functional layer 14 is fabricated of gallium nitride-based material using, for example, an MOCVD method, an organometallic gas containing at least gallium (Ga) (e.g. trimethylgallium) and a gas containing at least nitrogen (N) (e.g. ammonia) may flow as raw materials on the substrate so that the layer is grown in an atmosphere containing hydrogen, nitrogen, or both within a temperature range of about 300 to 1200 degrees C. In this case, an organometallic gas containing indium (In), aluminum (Al), and silicon (Si) and magnesium (Mg) as n-type and p-type dopants for bandgap control (e.g. trimethylindium, trimethylaluminum, monosilane, disilane, bis-cyclopentadienylmagnesium) may be appropriately introduced for film formation.

Alternatively, if a non-gallium nitride-based material is used for the light emitting functional layer 14 and the buffer layer, a seed crystal layer may be formed on the free-standing substrate. The film formation method and material for the seed crystal layer is not limited as long as it promotes the crystal growth generally following the crystal orientation. For example, if a zinc oxide-based material is used partially or entirely in the light emitting functional layer 14, a vapor phase epitaxy method such as a MOCVD method, MBE method, HVPE method, or sputtering method may be used to fabricate an ultrathin zinc oxide seed crystal.

An electrode layer 16 and/or a phosphor layer may further be provided on the light emitting functional layer 14. As described above, since a light emitting device using the conductive polycrystalline gallium nitride free-standing substrate 12 can take a vertical structure, an electrode layer 18 may be provided also on the bottom surface of the free-standing substrate 12 as shown in FIG. 1, while the free-standing substrate 12 may be used as an electrode itself and, in this case, the free-standing substrate 12 is preferably added with n-type dopants. The electrode layers 16, 18 are only required to be composed of a known electrode material, and the electrode layer 16 on the light emitting functional layer 14 is preferably a transparent conductive film such as ITO or a metal electrode with a high aperture ratio of, for example, the lattice structure to increase the efficiency of extraction of light generated in the light emitting functional layer 14.

If the light emitting functional layer 14 can emit ultraviolet light, a phosphor layer for converting the ultraviolet light into visible light may be provided on the outside of the electrode layer. The phosphor layer is not particularly limited as long as it contains known fluorescent components capable of converting ultraviolet light into visible light. For example, a fluorescent component excited by ultraviolet light to emit blue light, a fluorescent component excited by ultraviolet light to emit blue to green light, and a fluorescent component excited by ultraviolet light to emit red light are preferably mixed to provide white light as a mixed color. A preferable combination of such fluorescent components may include $(Ca,Sr)_5(PO_4)_3Cl$:Eu, $BaMgAl_{10}O_{17}$:Eu, and Mn, $Y_2O_3S$:Eu, and these components are preferably dispersed in a resin such as a silicone resin to form a phosphor layer. Such fluorescent components are not limited to the materials exemplified above, and other ultraviolet-excited phosphors may be combined such as yttrium aluminum garnet (YAG) or silicate-based phosphors and oxynitride-based phosphors.

On the other hand, if the light emitting functional layer 14 can emit blue light, a phosphor layer for converting blue light into yellow light may be provided on the outside of the electrode layer. The phosphor layer is not particularly limited as long as it contains known fluorescent components capable of converting blue light into yellow light. For example, it may be combined with a phosphor that emits yellow light, such as YAG. This causes a blue emission through the phosphor layer and yellow emission from the phosphor to be complementary and thereby to serve as a pseudo while light source. It is noted that the phosphor layer may contain both a fluorescent component for converting blue into yellow and a fluorescent component for converting ultraviolet light into visible light as well as convert blue light into yellow light.

(Application)

The free-standing substrate according to the present invention can preferably be utilized not only for the above-described light emitting device, but also for various applications such as various types of electronic devices, power devices, light receiving devices, and photovoltaic cell wafers.

EXAMPLES (Method of Evaluating Pits)

Surfaces of free-standing substrates of the respective examples were polished, washed and observed by a scanning type electron microscope ("S-3400N" supplied by HITACHI Hi Technologies Co. Ltd.) at a magnitude of 50 fold to measure the sizes and occurrence of the pits. Further, the surface of the gallium nitride free-standing substrate was observed using a non-contact type surface morphology measuring system ("New View 7000" supplied by Zygo Co. Ltd. Object lens x 5 folds, software "MetroPro 9.0 10) in an observation field of 1.4 mm×1.05 mm to calculate Rms. Here, Rms means a numerical value indicating the root mean roughness, which corresponds to a root of a value obtained by averaging squares of differences from an average line of the top surface of the free-standing substrate to a curve to be measured and calculated by the following formula.

$$Rms = \sqrt{\frac{1}{\ell}\int_0^\ell f(x)^2 dx}$$

The results were compared and studied to find the following. That is, as the sizes of the pits become larger and occurrence of the pits becomes higher, the Rms value becomes larger. That is, from the viewpoint of improving the yield of devices produced on the free-standing substrate of gallium nitride, it is preferred that the pit size is smaller and occurrence of the pits is lower. In other words, from the viewpoint of improving the yield of devices produced on the free-standing substrate of gallium nitride, the Rms value is preferably smaller. As the result of studies by the present inventors, it was proven that, if the Rms value is 3.0 nm or smaller, semiconductor devices can be produced at a good yield.

(Concentrations of Ca and Zn in Crystal)

The concentrations of Ca and Zn contained in the gallium nitride free-standing substrate were measured using SIMS (secondary ion mass spectroscopy). Specifically, an apparatus IMS-7f from CAMECA GmbH was used and $O_2^+$ or $Cs^+$ was used as primary ionic species to perform SIMS measurements at an acceleration voltage of 5 kV to 15 kV from the surface to a depth of 3 µm in a region of 20×20 µm or φ30 µm and thereby measure the concentrations of Ca and Zn contained in the gallium nitride crystal.

(Specific Resistivity)

The specific resistivity was measured by a Hall-effect measuring method or two-terminal method. A sample for measuring specific resistivity was processed and polished to a size of 6 mm×6 mm×0.35 mm and an ohmic electrode (Ti/Al) for measuring electric characteristics was formed by a vapor deposition method. In the case that the hall-effect measurement was performed, the electrodes were formed at the four corners, and in the case of the two-terminal method, the electrodes were formed on both of the top and bottom surfaces, and the measurement was performed at room temperature.

Examples of fabrication and evaluation of free-standing substrates of the respective examples are shown below.

First Reference Example (1) Fabrication of a c-Plane Oriented Alumina Sintered Body 100 parts by mass of fine alumina powder (TM-DAR (average particle diameter of 0.1 µm) from Taimei Chemicals Co., Ltd.) was added and mixed with 0.0125 parts by mass (125 ppm by mass) of magnesium oxide (500 A from Ube Material Industries), 7.8 parts by mass of polyvinyl butyral (part number BM-2 from Sekisui Chemical Co., Ltd.) as a binder, 3.9 parts by mass of di(2-ethylhexyl)+ phthalate (from Kurogane Kasei Co., Ltd.) as a plasticizer, 2 parts by mass of triolein acid sorbitan (Leodol SP-030 from Kao Corporation) as a dispersant, and 2-ethylhexanol as a dispersion medium. The amount of the dispersion medium was adjusted so that the slurry viscosity was 20000 cP. The thus prepared slurry was shaped by a doctor blade method on a PET film into a sheet with a thickness after drying of 40 µm to be a fine alumina powder layer.

Next, commercially available plate-like alumina powder (grade YFA10030 from Kinsei Matec Co., Ltd.) was classified in an air flow classifier (TC-15N from Nisshin Engineering Inc.) with the classification point set at 3 µm. The plate-like alumina powder from which coarse particles were thus removed was crushed for 20 hours with cobbled stones with a diameter of 0.3 mm in a pot crusher and, at the end, fine particulate powder was removed through elutriation. 100 parts by mass of the resulting plate-like alumina powder was added with 500 parts by mass of isopropyl alcohol as a dispersion medium. The resulting dispersion liquid (plate-like alumina slurry) was dispersed for five minutes in an ultrasonic disperser and then sprayed with a spray gun (Spray work-HG air brush wide from Tamiya Inc.) at a spray pressure of 0.2 MPa and a spray distance of 20 cm onto one side of the fine alumina powder layer to provide a one-side processed body. Upon this, the coverage rate at which the plate-like alumina powder covers the surface of the fine alumina powder layer was 1%.

It is noted that the coverage rate of the one-side processed body was calculated as follows. That is, the surface of the fine alumina powder layer was observed with an optical microscope and the observation photo was image-processed into the part of the plate-like alumina powder and the other part, where the proportion of the area of the plate-like alumina powder to the area of the surface of the fine alumina powder layer in the observation photo, was defined as the coverage rate.

The resulting one-side processed body was cut into a circle with a bore of 60 mm and then peeled off from the PET film, laminated into 65 layers such that the sprayed processed surface does not overlap with each other, placed on an Al plate with a thickness of 10 mm, and then put into a package, on which a vacuum was drawn to be vacuum packaging. The vacuum packaging underwent hydrostatic pressing at a pressure of 100 kgf/cm$^2$ in warm water of 85 degrees C. to provide a laminated body.

The resulting laminated body was plated in a degreasing furnace and degreased under the conditions of 600 degrees C. and 10 hours. The resulting degreased body was sintered by hot pressing using a graphite mold in nitrogen under the conditions of a sintering temperature (topmost temperature) of 1975 degrees C., for four hours, and a surface pressure of 200 kgf/cm$^2$) to provide an alumina sintered body. It is noted that the pressure was maintained until the sintering temperature dropped to 1200 degrees C. and released to be zero within a temperature range of less than 1200 degrees C.

The thus obtained sintered body was fixed on a ceramic surface plate and ground using a grinding stone to #2000 so that the plate face was flat. Next, the plate face was smoothened through lap processing using diamond abrasive particles to provide an oriented alumina sintered body with a bore of 60 mm and a thickness of 0.5 mm as an oriented alumina substrate. The size of the abrasive particles were reduced stepwise from 3 µm to 0.5 µm to increase the flatness. The arithmetic average roughness Ra after processing was 4 nm.

(2) Fabrication of Ge Doped Polycrystalline Gallium Nitride Free-Standing Substrate (2a) Film Formation of a Seed Crystal Layer Next, an MOCVD method was used to form a seed crystal layer on the processed oriented alumina substrate. Specifically, a low-temperature GaN layer was deposited by 30 nm at a susceptor temperature of 530 degrees C. in a hydrogen atmosphere as a buffer layer and then a GaN film with a thickness of 3 µm was laminated at an increased susceptor temperature of 1050 degrees C. in a nitrogen and hydrogen atmosphere to provide a seed crystal substrate.

(2b) Film Formation of a Ge Doped GaN Layer by a Na Flux Method

The seed crystal substrate fabricated in the step above was installed at the bottom of a cylindrical flat-bottomed alumina crucible with an inside diameter of 80 mm and a height of 45 mm, and then the crucible was filled with a melt composition in a glove box. The composition of the melt composition is as follows:

metallic Ga: 60 g
metallic Na: 60 g
germanium tetrachloride: 1.85 g.

The alumina crucible was put and sealed in a heat-resistant metal container and then installed on a pedestal capable of rotating a crystal growing furnace. After increasing the temperature and pressure to 870 degrees C. and 3.5 MPa in a nitrogen atmosphere, the solution was rotated with the condition maintained for 100 hours to grow a gallium nitride crystal while stirring. After the crystal growth, three hours were taken for slow cooling back to the room temperature and the growing container was taken out of the crystal growing furnace. Ethanol was used to remove the melt composition remaining in the crucible and the sample with a gallium nitride crystal grown therein was recovered. In the resulting sample, a Ge doped gallium nitride crystal was grown on the entire 60-mm seed crystal substrate with the crystal having a thickness of 1.4 mm. No cracking was seen.

The oriented alumina substrate of the thus obtained sample was removed through grinding processing using a grinding stone to provide a single body of Ge doped gallium nitride. The plate face of the Ge doped gallium nitride crystal was ground by abrasives of #600 and #2000 to be flattened. Further, the plate face was smoothened through lap processing using diamond abrasives to provide a Ge doped polycrystalline gallium nitride free-standing substrate with a thickness of about 300 μm. Upon the smoothing, the flatness was improved by that the sizes of the abrasives were lowered stepwise from 3 μm to 0.1 μm. The arithmetic average roughness Ra after processing of the surface of the polycrystalline gallium nitride free-standing substrate was 0.2 nm.

(Evaluation of the Average Cross-Sectional Diameter of the Polycrystalline Gallium Nitride Free-Standing Substrate)

In order to measure the average cross-sectional diameter of GaN monocrystalline particles at the outermost surface of the polycrystalline gallium nitride free-standing substrate, a scanning electron microscope was used to take images on the top surface of the free-standing substrate. The field of view was set to be a range within which a straight line can be drawn diagonally in the obtained images so as to intersect with 10 to 30 columnar structures. The lengths of line segments within all individual particles with which any two straight lines drawn diagonally in the obtained images intersect were averaged and multiplied by 1.5 to obtain the average cross-sectional diameter of GaN monocrystalline particles at the outermost surface of the polycrystalline gallium nitride free-standing substrate. As a result, the average cross-sectional diameter was proved to be about 140p m.

(Evaluation of Pits of Ge-Doped Gallium Nitride Free-Standing Substrate)

Figure 2:
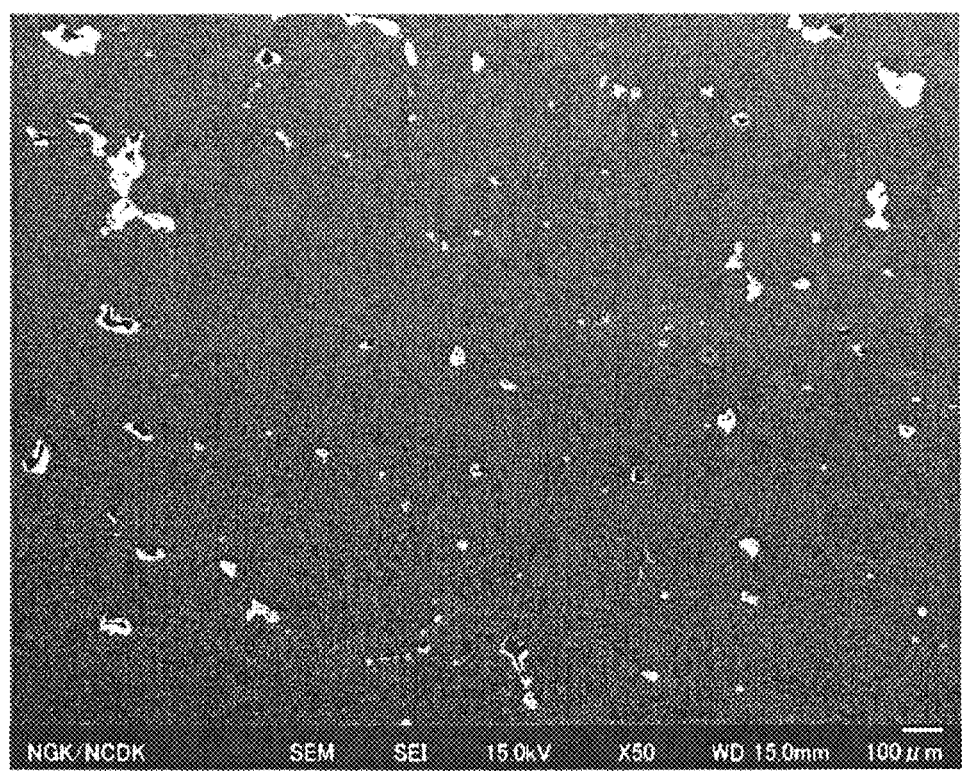
FIG. 2 is a photograph taken by as scanning type electron microscope showing the state of a top surface of a polycrystalline nitride of a group 13 element in Reference Example 1.

The top surface (outermost surface) of the Ge-doped gallium nitride free-standing substrate was observed by a scanning type electron microscope, so that it was observed pits of irregular shapes whose side had a size of about 50 to 200 μm (see FIG. 2). The Rms was calculated in an observation field of 1.4 mm×1.05 mm using a non-contact type surface morphology measuring system ("New View 7000" supplied by Zygo Co. Ltd.) to be 15.0 nm.

((3) (Production of a Light-Emitting Device Using a Ge-Doped Gallium Nitride Free-Standing Substrate)
((3a) (Film-Formation of a Light Emitting Functional Layer by the MOCVD Method)

Using the MOCVD method, on the free-standing gallium nitride substrate, as an n-type layer, it was deposited an n-GaN layer of 1 μm at 1050° C. doped so that an atomic concentration of Si atoms became $5 \times 10^{18}/cm^3$. Then, as a light-emitting layer, multiple quantum well layers at 750° C. were deposited. Specifically, five layers of well layers of 2.5 nm of InGaN and six layers of barrier layers of 10 nm of GaN were alternately deposited. Then, as a p-type layer, a p-type GaN of 200 nm was deposited at 950° C. doped so that an atomic concentration of Mg atoms became $1 \times 10^{19}/cm^3$. Thereafter, it was taken out of an MOCVD apparatus and then subjected to heat treatment at 800° C. in a nitrogen atmosphere for 10 minutes as an activating treatment of Mg ions in the p-type layer.

(3b: Production of Light-Emitting Device)

Using a photolithography process and vapor deposition method, on the opposite side of the n-GaN layer and p-GaN layer of the free-standing gallium nitride substrate, a Ti film, Al film, Ni film and Au film were patterned in thicknesses of 15 nm, 70 nm, 12 nm and 60 nm, respectively as a cathode electrode. Thereafter, for assuring ohmic contact characteristics, heat treatment was performed at 700° C. for 30 seconds under a nitrogen atmosphere. Further, using a photolithography process and vapor deposition method, a Ni film and Au film were patterned in thicknesses of 6 nm and 12 nm, respectively, as a transparent anode on the p-type layer. Thereafter, for assuring the ohmic contact characteristics, heat treatment was performed at 500° C. for 30 seconds under a nitrogen atmosphere. Further, using a photolithography process and vapor deposition method, on a part of a top surface of the Ni and Al films as the transparent anode, Ni and Au films were patterned in thicknesses of 5 nm and 60 nm, respectively, as a pad for the anode, The thus obtained wafer was cut into chips, which were mounted on a lead frame to obtain light-emitting devices of a vertical type structure.

(3c: Evaluation of Light-Emitting Device)

Twenty samples were arbitrarily selected from the thus produced devices, and electricity was flowed between the cathode and anode to perform the I-V measurement. Rectification was confirmed in 10 of the samples. Further, a current was flowed in the forward direction to confirm the luminescence of a wavelength of 450 nm.

First Inventive Example; a Ge Doped Polycrystalline Gallium Nitride Free-Standing Substrate Containing Ca (1) Fabrication of a Ge Doped Polycrystalline Gallium Nitride Free-Standing Substrate
(1a) Film Formation of a Seed Crystal Layer An oriented $Al_2O_3$ substrate was fabricated in the same way as in the first reference example and an MOCVD method was used to form a seed crystal layer.
(1b) Film Formation of a Ge Doped GaN Layer Containing Ca by a Na Flux Method A Ge doped GaN layer was formed in the same way as in the first comparative example, except that 0.1 g of Ca metal was added. In the resulting sample, a Ge doped gallium nitride crystal was grown on the entire 60-mm seed crystal substrate with the crystal having a thickness of 1.2 mm. No cracking was seen.

Figure 3:
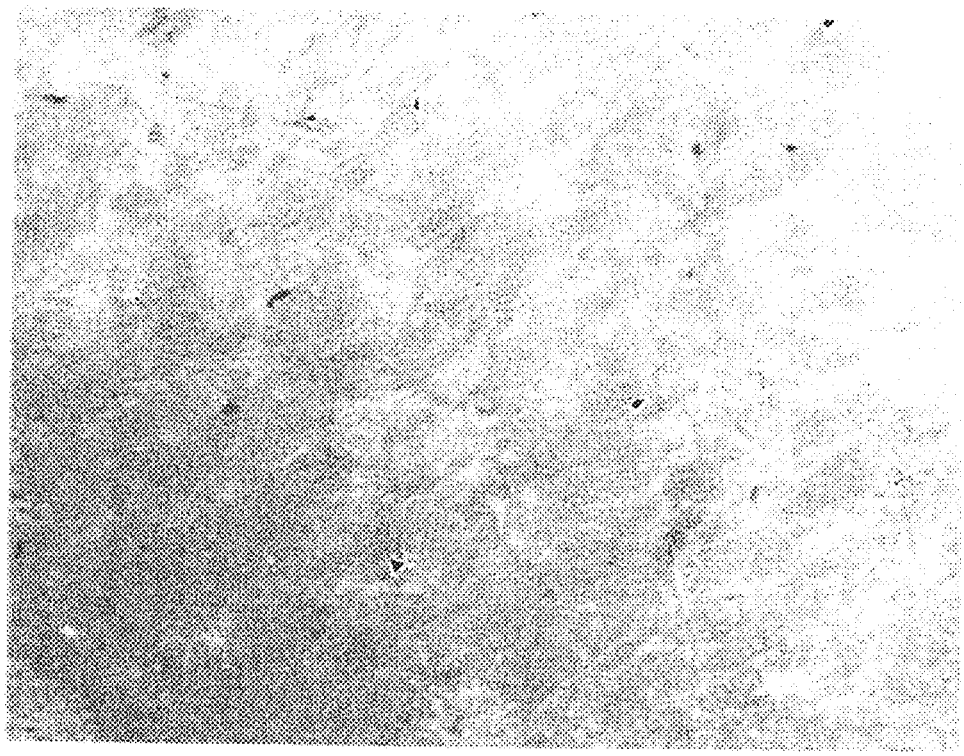
FIG. 3 is a photograph taken by a scanning type electron microscope showing the state of a top surface of a polycrystalline nitride of a group 13 element in Inventive Example 1.

The surface of the Ge-doped gallium nitride free-standing substrate was polished according to the same procedure as the reference example 1 and then observed by a scanning type electron microscope. It was thus slightly observed pits of an irregular shape whose side was about 20 to 100 μm (refer to FIG. 3).

Rms was calculated in an observation field of 1.4 mm×1.05 mm using a non-contact type surface morphology measuring system ("New View 7000" supplied by Zygo Co. Ltd.) to be 2.0 nm. The average size at the cross-section was measured based on an image taken by the scanning type electron microscope and proved to be about 160 μm.

Twenty samples were arbitrarily selected from the devices produced as in the same way as the First Reference Example, and electricity was flowed between the cathode and anode to perform the I-V measurement. Rectification was confirmed in 16 of the twenty samples. Further, current was flowed in the forward direction to confirm the luminescence of a wavelength of 450 nm.

Second Inventive Example: a Zn-Doped Gallium Nitride Free-Standing Substrate (1) Fabrication of a Zn-Doped Polycrystalline Gallium Nitride Free-Standing Substrate
(1a) Film Formation of a Seed Crystal Layer
An oriented $Al_2O_3$ substrate was fabricated in the same way as in the first reference example and an MOCVD method was used to form a seed crystal layer.
(1b) Film Formation of a Zn-Doped GaN Layer by a Na Flux Method
A Zn-doped GaN layer was formed in the same way as in the first comparative example, except that 0.5 g of metal Zn was added instead of germanium tetrachloride. In the resulting sample, a Zn-doped gallium nitride crystal was grown on the entire 60-mm seed crystal substrate with the crystal having a thickness of about 1.0 mm. No cracking was seen.

Figure 4:
FIG. 4 is a photograph taken by a scanning type electron microscope showing the state of a top surface of a polycrystalline nitride of a group 13 element in Inventive Example 2.

The surface of the Zn-doped gallium nitride free-standing substrate was polished according to the same procedure as the reference example 1 and then observed by a scanning type electron microscope. A pit whose side had a size exceeding 20 μm was not observed (refer to FIG. 4).

The Rms was calculated in an observation field of 1.4 mm×1.05 mm using a non-contact type surface morphology measuring system ("New View 7000" supplied by Zygo Co. Ltd.) to be 0.6 nm. The average size at the cross-section was measured based on an image taken by the scanning type electron microscope and proved to be about 200 μm.

Second Reference Example: Li Added and Ge-Doped Gallium Nitride Free-Standing Substrate (1) Fabrication of Ge-Doped Polycrystalline Gallium Nitride Free-Standing Substrate
(1a) Film Formation of a Seed Crystal Layer
An oriented $Al_2O_3$ substrate was fabricated in the same way as in the first reference example and an MOCVD method was used to form a seed crystal layer.
(1b) Film Formation of a Li Added and Ge-Doped GaN Layer by a Na Flux Method
A Ge-doped GaN layer was formed in the same way as in the first comparative example, except that 0.1 g of metal Li was added. In the resulting sample, a Ge-doped gallium nitride crystal was grown on the entire 60-mm seed crystal substrate with the crystal having a thickness of about 0.8 mm. Two lines of cracks were confirmed inside of the substrate.

Figure 5:
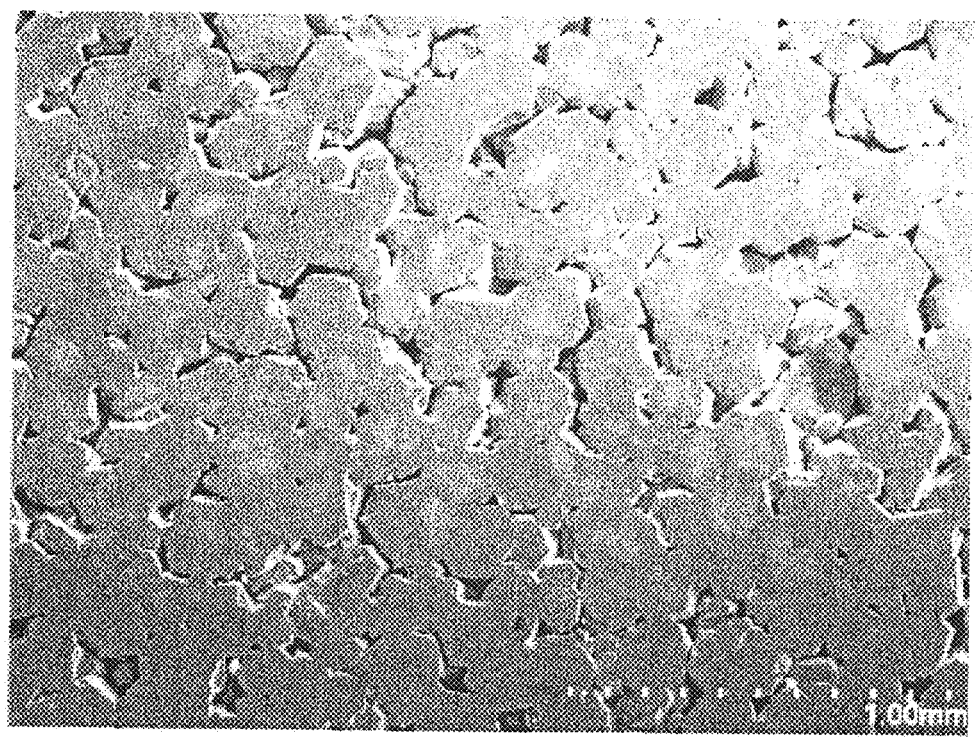
FIG. 5 is a photograph taken by a scanning type electron microscope showing the state of a top surface of a polycrystalline nitride of a group 13 element in Reference Example 2.

The surface of the Ge-doped gallium nitride free-standing substrate was polished according to the same procedure as the reference example 1 and then observed by a scanning type electron microscope. Many pits whose side had a size exceeding 200 μm were observed (refer to FIG. 5).

The Rms was calculated in an observation field of 1.4 mm×1.05 mm using a non-contact type surface morphology measuring system ("New View 7000" supplied by Zygo Co. Ltd.) to be 80 nm. The average size at the cross-section was measured based on an image taken by the scanning type electron microscope and proved to be about 70p m.

Twenty samples were arbitrarily selected from the thus produced devices, and electricity was flowed between the cathode and anode to perform the I-V measurement. Rectification was confirmed only in 4 of the twenty samples. Further, current was flowed in the forward direction to confirm the luminescence of a wavelength of 450 nm.

Third Reference Example: Gallium Nitride Free-Standing Substrate Grown with No Element Added (1) Fabrication of Undoped Polycrystalline Gallium Nitride Free-Standing Substrate
(1a) Film Formation of a Seed Crystal Layer
An oriented $Al_2O_3$ substrate was fabricated in the same way as in the first comparative example and an MOCVD method was used to form a seed crystal layer.
(1b) Film Formation of a GaN Layer by a Na Flux Method
An undoped GaN layer was formed in the same way as in the first comparative example with no element added other than metal Ga and metal Na. In the resulting sample, a gallium nitride crystal was grown on the entire 60-mm seed crystal substrate with the crystal having a thickness of about 1.6 mm. No cracking was seen.

Figure 6:
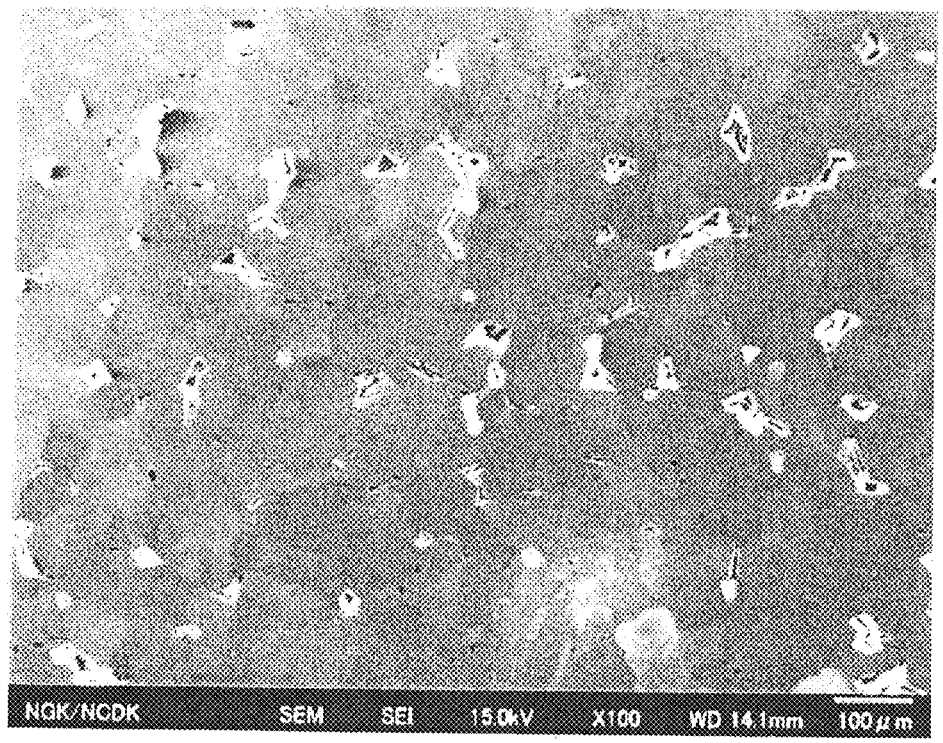
FIG. 6 is a photograph taken by a scanning type electron microscope showing the state of a top surface of a polycrystalline nitride of a group 13 element in Reference Example 3.

The surface of the undoped gallium nitride free-standing substrate was polished according to the same procedure as the reference example 1 and then observed by a scanning type electron microscope. Pits of an irregular shape whose side had a size of 50 to 100 μm were observed (refer to FIG. 6).

The Rms was calculated in an observation field of 1.4 mm×1.05 mm using a non-contact type surface morphology measuring system ("New View 7000" supplied by Zygo Co. Ltd.) to be 23 nm. The average size at the cross-section was measured based on an image taken by the scanning type electron microscope and proved to be about 130 μm.

Twenty samples were arbitrarily selected from the devices produced as in the same way as the First Reference Example, and electricity was flowed between the cathode and anode to perform the I-V measurement. Rectification was confirmed in 8 of the twenty samples. Further, current was flowed in the forward direction to confirm the luminescence of a wavelength of 450 nm.

Third Inventive Example: Ca-Added Gallium Nitride Free-Standing Substrate (1) Fabrication of Gallium Nitride Free-Standing Substrate
(1a) Film Formation of a Seed Crystal Layer
An oriented $Al_2O_3$ substrate was fabricated in the same way as in the first reference example and an MOCVD method was used to form a seed crystal layer.
(1b) Film Formation of a GaN Layer by a Na Flux Method
An undoped GaN layer was formed in the same way as in the third comparative example, except that 0.1 g of metal Ca was added. In the resulting sample, a gallium nitride crystal was grown on the entire 60-mm seed crystal substrate with the crystal having a thickness of about 1.3 mm. No cracking was seen.

The surface of the undoped gallium nitride free-standing substrate was polished according to the same procedure as the reference example 1 and then observed by a scanning type electron microscope. Pits of an irregular shape whose side had a size of 30 to 100 μm were slightly observed. The Rms was calculated in an observation field of 1.4 mm×1.05 mm using a non-contact type surface morphology measuring system ("New View 7000" supplied by Zygo Co. Ltd.) to be 2.6 μm. The cross-sectional average diameter was calculated based on an image of the scanning type electron microscope and proved to be about 150 μm.

Twenty samples were arbitrarily selected from the devices produced as in the same way as the First Reference Example, and electricity was flowed between the cathode and anode to perform the I-V measurement. Rectification was confirmed in 15 of the twenty samples. Further, current was flowed in the forward direction to confirm the luminescence of a wavelength of 450 nm.

Further, as to the examples described above, table 1 shows the Ca and Zn concentrations in the melt, and Ca and Zn concentrations of the crystal. Further, table 2 shows the presence or absence of cracks, average particle size in cross-section, pits, Rms, rectification and specific resistivity of each device.

TABLE 1

|  | Reference Example 1 | Inventive Example 1 | Inventive Example 2 | Reference Example 2 | Reference Example 3 | Inventive Example 3 |
|---|---|---|---|---|---|---|
| Dopant | Ge | Ge + Ca | Zn | Ge + Li | Undoped | Ca |
| Ca concentration in melt (mol %) | — | 0.3 | — | — | — | 0.3 |
| Zn concentration in melt (mol %) | — | — | 2.0 | — | — | — |
| Ca concentration in crystal (/cm$^3$) | — | $5 \times 10^{16}$ | — | — | — | $1 \times 10^{17}$ |
| Zn concentration in crystal (/cm$^3$) | — | — | $3 \times 10^{18}$ | — | — | — |

TABLE 2

|  | Reference Example 1 | Inventive Example 1 | Inventive Example 2 | Reference Example 2 | Reference Example 3 | Inventive Example 3 |
|---|---|---|---|---|---|---|
| Crack | None | None | None | Two lines | None | None |
| Cross sectional average diameter (μm) | 140 | 160 | 200 | 70 | 130 | 15 |
| Pit Size (μm) | 50~200 | 20~100 | <20 | >200 | 50~100 | 30~100 |
| Observation | Observed | Slightly seen | Not seen | Many pits observed | Observed | Slightly seen |
| Rms(nm) | 15.0 | 2.0 | 0.6 | 80 | 23 | 2.6 |
| Confirmation of Rectification (In 20 devices) | 10 | 16 | — | 4 | 8 | 15 |
| Specific resistivity (Ωcm) //c-axis (Direction of thickness) | 0.02 | 0.03 | 100 | 1 | 0.2 | 0.5 |
| Specific resistivity (Ωcm) ⊥c-axis (In-plane) | 1.0 | 0.4 | 500 | 300 | 1.0 | 5 |
| Ratio of specific resistivities (In-plane/thickness) | 50 | 13 | 5 | 300 | 5 | 10 |

Examples 4, 5 and 6

In the second inventive example, the concentration of Zn added to the melt was variously changed as shown in table 3. Then, as to the examples described above, table 3 shows the Zn concentration in the melt, Zn concentration of the crystal, the presence or absence of cracks, cross-sectional average diameter, Rms and specific resistivity.

TABLE 3

|  | Reference Example 3 | Inventive Example 4 | Inventive Example 2 | Inventive Example 5 | Inventive Example 6 |
|---|---|---|---|---|---|
| Zn concentration in melt (mol %) | — | 1.0 | 2.0 | 3.5 | 7.5 |
| Zn concentration in crystal (/cm$^3$) | — | $1 \times 10^{18}$ | $3 \times 10^{18}$ | $6 \times 10^{18}$ | $1 \times 10^{19}$ |
| Crack | None | None | None | None | None |
| Cross sectional average diameter (μm) | 130 | 180 | 200 | 250 | 320 |
| Pit Size | 50~100 | 20~100 | <20 | <20 | <20 |
| Observation | Observed | Slightly seen | Not seen | Not seen | Slightly seen |
| Rms(nm) | 23 | 2.5 | 0.6 | 0.8 | 1.7 |
| Specific resistivity (Ωcm) //c-axis (Direction of thickness) | 0.2 | 10 | 100 | $1 \times 10^4$ | $1 \times 10^6$ |

TABLE 3-continued

|  | Reference Example 3 | Inventive Example 4 | Inventive Example 2 | Inventive Example 5 | Inventive Example 6 |
|---|---|---|---|---|---|
| Specific resistivity (Ωcm) ⊥c-axis (In-plane) | 1.0 | 100 | 500 | $2 \times 10^4$ | $1.5 \times 10^6$ |
| Ratio of specific resistivities (In-plane/thickness) | 5 | 10 | 5 | 2 | 1.5 |

The invention claimed is:

1. A free-standing substrate of a polycrystalline nitride of a group 13 element comprising a plurality of monocrystalline particles having a particular crystal orientation in approximately a normal direction, wherein
said polycrystalline nitride of said group 13 element comprises gallium nitride, aluminum nitride, indium nitride or a mixed crystal thereof;
said free-standing substrate has a top surface and bottom surface,
said free-standing substrate contains at least one of zinc and calcium, and
a root mean square roughness Rms at said top surface is 3.0 nm or less.

2. The free-standing substrate of claim 1, further comprising germanium.

3. The free-standing substrate of claim 1, wherein an average cross-sectional diameter DT at outermost surfaces of said monocrystalline particles exposed on said top surface is equal to or greater than 10 μm.

4. The free-standing substrate of claim 3, wherein a ratio DT/DB of said average cross-sectional diameter DT at said outermost surfaces of said monocrystalline particles exposed on said top surface and an average cross-sectional diameter DB at said outermost surfaces of said monocrystalline particles exposed on said bottom surface exceeds 1.0.

5. The free-standing substrate of claim 1, wherein said monocrystalline particles exposed at said top surface was communicated to said bottom surface without intervening a particle boundary.

6. The free-standing substrate of claim 1, wherein said nitride of said group 13 element comprises a gallium nitride series nitride.

7. The free-standing substrate of claim 1, comprising zinc.

8. The free-standing substrate of claim 7, wherein a specific resistivity of said free-standing substrate in a plane is 50 Ω·cm or higher and $1 \times 10^7$ Ω·cm or lower.

9. The free-standing substrate of claim 7, wherein a specific resistivity of said free-standing substrate in a direction of thickness is 5 Ω·cm or higher and $1 \times 10^7$ Ω·cm or lower.

10. The free-standing substrate of claim 7, wherein a ratio of a specific resistivity of said free-standing substrate in a plane with respect to a specific resistivity of said free-standing substrate in a direction of thickness is 1.3 or higher and 15 or lower.

11. A light emitting device comprising:
the free-standing substrate of claim 1; and
a light emitting functional layer formed on said free-standing substrate and having at least one layer having a single crystal structure in approximately a normal direction and comprising a plurality of semiconductor monocrystalline particles.

12. The free-standing substrate of claim 7, wherein a concentration of zinc is $1 \times 10^{17}$ atoms/cm$^3$ or higher and $1 \times 10^{20}$ atoms/cm$^3$ or lower.

13. The free-standing substrate of claim 1, wherein a concentration of calcium is $5 \times 10^{15}$ atoms/cm$^3$ or higher and $1 \times 10^{19}$ atoms/cm$^3$ or lower.

* * * * *